US006807197B2

(12) United States Patent
Islam

(10) Patent No.: US 6,807,197 B2
(45) Date of Patent: Oct. 19, 2004

(54) GAIN CONTROL IN NONLINEAR POLARIZATION AMPLIFIER STAGES

(75) Inventor: Mohammed N. Islam, Allen, TX (US)

(73) Assignee: Xtera Communications, Inc., Allen, TX (US)

( * ) Notice: Subject to any disclaimer, the term of this patent is extended or adjusted under 35 U.S.C. 154(b) by 23 days.

(21) Appl. No.: 10/187,672

(22) Filed: Jul. 1, 2002

(65) Prior Publication Data

US 2003/0053198 A1 Mar. 20, 2003

Related U.S. Application Data

(60) Continuation of application No. 10/033,848, filed on Dec. 19, 2001, which is a division of application No. 09/550,730, filed on Apr. 17, 2000, now Pat. No. 6,370,164, which is a division of application No. 09/110,696, filed on Jul. 7, 1998, now Pat. No. 6,052,393.
(60) Provisional application No. 60/080,317, filed on Apr. 1, 1998.

(51) Int. Cl.[7] .................................................. H01S 3/30
(52) U.S. Cl. ........................... 372/3; 372/30; 359/334
(58) Field of Search ................ 372/3, 30, 6, 27, 372/69, 70; 359/334

(56) References Cited

U.S. PATENT DOCUMENTS

| 4,616,898 | A |   | 10/1986 | Hicks, Jr. ....................... 385/24 |
| 4,922,481 | A |   | 5/1990  | Hicks ............................. 320/4 |
| 5,497,386 | A | * | 3/1996  | Fontana ......................... 372/18 |
| 5,574,739 | A | * | 11/1996 | Carruthers et al. ............ 372/27 |
| 5,617,434 | A | * | 4/1997  | Tamura et al. ................. 372/6 |
| 5,696,615 | A |   | 12/1997 | Alexander ..................... 356/134 |
| 5,778,014 | A | * | 7/1998  | Islam ............................ 372/6 |
| 5,898,716 | A | * | 4/1999  | Ahn et al. ..................... 372/6 |
| 5,912,910 | A |   | 6/1999  | Sanders et al. ................ 359/326 |
| 5,920,423 | A |   | 7/1999  | Grubb et al. .................. 359/341 |
| 5,959,750 | A |   | 9/1999  | Eskildsen et al. ............. 359/134 |
| 6,049,413 | A |   | 4/2000  | Taylor et al. .................. 359/337 |
| 6,081,366 | A |   | 6/2000  | Kidorf et al. .................. 359/334 |
| 6,320,884 | B1|   | 11/2001 | Kerfoot, III et al. ........... 372/334 |
| 6,356,383 | B1|   | 3/2002  | Cornwell, Jr. et al. ........ 359/334 |
| 6,356,384 | B1|   | 3/2002  | Islam ............................ 359/334 |
| 6,359,725 | B1|   | 3/2002  | Islam ............................ 359/334 |
| 6,370,164 | B1|   | 4/2002  | Islam ............................ 372/6 |
| 6,374,006 | B1|   | 4/2002  | Islam et al. ................... 385/15 |
| 6,381,391 | B1|   | 4/2002  | Islam et al. ................... 385/123 |

(List continued on next page.)

FOREIGN PATENT DOCUMENTS

| EP | 0 339 840 A3 | 11/1989 | ............ H04B/9/00 |
| JP | 58208731     | 12/1983 | ............ G02F/1/35 |
| WO | 02/058286 A2 | 7/2002  | ............ H04B/10/00 |

OTHER PUBLICATIONS

Zou et al., "Compensation of Raman Scattering and EDFA's Nonumiform Gain in Ultra–Long–Distance WDM Links," IEEE Photonics Technology Letters, vol. 8, No. 1, pp. 139–141, Jan. 1996.

(List continued on next page.)

Primary Examiner—Tan Ho
Assistant Examiner—Leith A Al-Nazer
(74) Attorney, Agent, or Firm—Baker Botts L.L.P.

(57) ABSTRACT

A nonlinear polarization amplifier stage includes a gain medium operable, to receive a multiple wavelength optical signal. The amplifier stage also includes a pump assembly operable to generate at least one pump wavelength for introduction to the gain medium. The amplifier stage further includes a coupler operable to introduce the at least one pump wavelength to the gain medium to facilitate amplification of at least a portion of the multiple wavelength optical signal through nonlinear polarization. In one particular embodiment, at least a wavelength or an intensity of the at least one pump wavelength is manipulated to affect the shape of a gain curve associated with the multiple wavelength optical signal in the amplifier stage.

79 Claims, 17 Drawing Sheets

U.S. PATENT DOCUMENTS

| | | |
|---|---|---|
| 6,388,801 B1 | 5/2002 | Sugaya et al. ............... 359/334 |
| 6,404,523 B1 | 6/2002 | Morikawa et al. ........... 359/124 |
| 6,417,959 B1 | 7/2002 | Bolshtyansky et al. ..... 359/334 |
| 6,532,101 B2 | 3/2003 | Islam et al. .................. 359/334 |
| 6,574,037 B2 | 6/2003 | Islam et al. .................. 359/334 |
| 6,587,259 B2 | 7/2003 | Islam et al. .................. 359/334 |
| 6,600,592 B2 | 7/2003 | Islam ........................... 359/334 |
| 2002/0048062 A1 | 4/2002 | Sakamoto et al. ........... 359/124 |
| 2002/0060821 A1 | 5/2002 | Manna et al. ................ 359/124 |
| 2003/0058899 A1 * | 3/2003 | Islam ............................ 372/6 |

OTHER PUBLICATIONS

Masuda et al., "Ultra–wideband optical amplification with 3dB bandwidth of 65 nm using a gain–equalised two–stage erbium–doped fibre amplifier and Raman amplification," Electronics Letters, vol. 33, No. 9, pp. 73–78, Feb. 24, 1997.

Masuda et al., "75–nm 3–dB Gain–band Optical Amplification with Erbium–Doped Fluoride Fibre Amplifiers and Distributed Raman Amplifiers in 9 × 2.5–Gb/s WDM Transmission Experiment," ECOC Conference, vol. 5, No. 448, pp. 73–76 plus 2 back pages, Sep. 22–25, 1997.

Tonguz et al., "Gain Equalization of EDFA Cascades," Journal of Lightwave Technology, vol. 15, No. 10, pp. 1832–1841, Oct. 1997.

Murakami et al., "WDM Upgrading of an Installed Submarine Optical Amplifier System," Journal of Lightwave Technology, vol. 19, No. 11, pp. 1665–1674, Nov. 2001.

Scheerer et al.,."SRS Crosstalk in Preemphasized WDM Systems," pp. WM28–1/293–WM28–3/295.

Pending patent application; U.S. Ser. No. 09/766,489; entitled "Nonlinear Polarization Amplifiers in Nonzero Dispersion Shifted Fiber," by Mohammed N. Islam, Filed Jan. 19, 2001.

* cited by examiner

GAIN CONTROL IN NONLINEAR POLARIZATION AMPLIFIER STAGES

CROSS-REFERENCE TO RELATED CASES

This application is a continuation of U.S. patent application Ser. No. 10/033,848, filed Dec. 19, 2001 and entitled "BROADBAND SAGNAC RAMAN AMPLIFIERS AND CASCADE LASERS," which is a divisional of U.S. patent application Ser. No. 09/550,730 filed Apr. 17, 2000, now U.S. Pat. No. 6,370,164.

U.S. Pat. No. 6,370,164 is a divisional of U.S. patent application Ser. No. 09/110,696, filed Jul. 7, 1998, now U.S. Pat. No. 6,052,393. U.S. Pat. No. 6,052,393 is a continuation-in-part of U.S. patent application Ser. No. 08/773,482 filed Dec. 23, 1996, now U.S. Pat. No. 5,778,014, and claims priority to U.S. provisional patent application Ser. No. 60/080,317 filed Apr. 1, 1998.

TECHNICAL FIELD OF THE INVENTION

The present invention relates generally to Sagnac Raman amplifiers and lasers for telecommunications, cable television (CATV), and other fiber-optics applications. More particularly, the invention relates to broadband Sagnac Raman amplifiers and lasers that have substantially improved bandwidth and noise performance.

BACKGROUND OF THE INVENTION

Because of the increase in data intensive applications, the demand for bandwidth in communications has been growing tremendously. In response, the installed capacity of telecommunication systems has been increasing by an order of magnitude every three to four years since the mid 1970s. Much of this capacity increase has been supplied by optical fibers that provide a four-order-of-magnitude bandwidth enhancement over twisted-pair copper wires.

To exploit further the bandwidth of optical fibers, two key technologies have been developed and used in the telecommunication industry: optical amplifiers and wavelength-division multiplexing (WDM). Optical amplifiers boost the signal strength and compensate for inherent fiber loss and other splitting and insertion losses. WDM enables different wavelengths of light to carry different signals parallel over the same optical fiber. Although WDM is critical in that it allows utilization of a major fraction of the fiber bandwidth, it would not be cost-effective without optical amplifiers. In particular, a broadband optical amplifier that permits simultaneous amplification of many WDM channels is a key enabler for utilizing the full fiber bandwidth.

With the advent of erbium-doped fiber amplifiers (EDFAs) around 1990 to replace electronic repeaters, the capacity of telecommunication systems has since been increased by almost two orders of magnitude. Although EDFAs have had a significant impact in the past five years, they are not without problems. As shown in FIG. 1a, there are two main low-loss telecommunications windows in silica-based optical fibers at wavelengths of 1.3 $\mu$m and 1.55 $\mu$m. EDFAs work only in the 1.55 $\mu$m window. Yet, most of the terrestrial fibers installed in the United States during the 1970s and up through the mid 1980s are designed for operation at 1.3 $\mu$m, and thousands of miles of 1.3 $\mu$m terrestrial fibers have already been laid. This presents major difficulties in upgrading to the higher bandwidth EDFA technology. In the prior art, some have sought to combine EDFAs with dispersion compensators in an effort to correct the wavelength mismatch. However this approach does not permit further upgrading based on wavelength-division-multiplexing, and therefore is not seen as the best solution. Others are experimenting with new glass formulations that might provide the advantages of EDFAs at the shorter 1.3 $\mu$m wavelength. However, currently no glass formulation has proven to be commercially viable.

Aside from the wavelength mismatch, EDFAs are also inherently prone to signal loss when the pump laser fails. EDFA is a system of the type known as a "three-level" system that does not allow the optical signal to pass through unless its pump laser is operative. Reliance on the "three-level" system could have catastrophic consequences for the reliability of fiber networks.

Stimulated Raman scattering amplifiers are advantageous over EDFAs because they can operate in both optical communication windows and, in fact, over the entire transparency window of optical fibers. Moreover, the stimulated Raman scattering amplifier is a "four-level" system that simply provides no gain when its pump laser is off, but otherwise allows the optical signal to pass through the system. Stimulated Raman scattering amplifiers are based on nonlinear polarization of the dielectric silica host, and are capable of cascading to higher Raman orders or longer wavelengths. However, there is a significant problem with Raman amplifiers that has not heretofore been really overcome. Virtually every light source or pump produces some intensity fluctuation. When Raman amplifiers are allowed to cascade through several orders, the pump source intensity fluctuations are combinatorially multiplied, and very rapidly result in enormous intensity fluctuations that have made systems virtually unusable. Compounding this problem, the gain produced by this nonlinear response is proportional to instantaneous pump intensity. Thus there is no opportunity to "average out" intensity fluctuations over time. Moreover, the gain produced by Raman scattering is, itself, an exponential effect. All of these properties have lead most to conclude that stimulated Raman scattering amplifiers and cascade lasers are not suitable in general-purpose telecommunication applications.

Aside from the fluctuation problems above, several other issues also need to be addressed in order to achieve usable broadband stimulated Raman scattering amplifiers. In the prior art, a cladding-pumped fiber laser has been used as a pump source for Raman amplifiers. A commercial unit delivers 9W of single-transverse-mode output at 1100 nm with a spectral width of 4 nm. The fiber used in this laser is a rare-earth-doped, double-clad fiber. As depicted in FIG. 14a, cavity mirrors are applied to the fiber ends. The mirror applied to the input end is highly reflective at the lasing wavelength of 1100 nm, while a low-reflectivity mirror or grating is applied to the output end of the fiber. The gain band for ytterbium doped fiber is roughly between 1030 nm and 1160 nm, but using a grating at the fiber end to select one particular wavelength yields a bandwidth of about 4 nm.

While this cladding-pumped fiber laser is already quite broad in bandwidth because of multiple longitudinal modes in the cavity, it would be desirous to further broaden the pump wavelength range to achieve broadband Raman gain. The broader pump bandwidth is also advantageous to avoid reflections associated with stimulated Brillouin scattering in the gain fiber of the Raman amplifier.

Polarization controllers (PCs) are used in almost all Raman amplifiers to regulate polarization states. A fiber based PC is typically constructed using quarter-wave loops of optical single-mode fiber mounted in such a way as to allow precise rotation of the loops about a common tangential axis. Each loop is designed to function as a quarter-wave retarder for the wavelength range of interest. By rotating a loop about its tangential axis, the loop's birefringence is rotated. Combining three or four loops in series increases the wavelength range and adjustment range of the controller and enables complete and continuous polarization adjustability. However, as the temperature changes, the fiber birefringence changes and the mechanical setting of the PCs may also be perturbed. As a result, the PCs may ruin the "turn-key" operation of the amplifier because they could require periodic readjustment with changing environmental conditions.

In the past attempts at applying Raman amplifiers to analog signal amplification, it was discovered that a major limitation arises from the noise associated with Double Rayleigh Scattering (DRS). Stimulated Rayleigh scattering refers to light scattering due to induced density variations of a material system. More specifically, stimulated Rayleigh refers to the scattering of light from isobaric density fluctuations.

Stimulated Rayleigh scattering gives rise to a backward traveling wave that is at the same center frequency as the signal input, somewhat broadened by the Rayleigh linewidth (defined as a reciprocal to characteristic decay time of the isobaric density disturbances that give rise to Rayleigh scattering). For example, J. L. Gimlett, et al., IEEE Photonics Technology Letters, Vol. 2, p.211 (March 1990) disclosed that the Rayleigh scattering can be modeled as a Rayleigh mirror with a prescribed reflectivity. DRS refers to a second stimulated Rayleigh scattering event that scatters the backward traveling wave back into the original signal, thereby leading to interference with the original signal, cross-talk, and increased uncertainty of the amplitude (i.e., noise). Also, the DRS is proportional to the pump intensity, the signal intensity, and the length of the gain fiber. Therefore, the DRS noise source is a direct consequence of requiring high pump powers and long interaction lengths due to the inefficiency of the Raman amplification process.

Prior art has shown that insertion of an optical isolator midway through the amplifier and the use of two WDMs to guide the pump radiation around the isolator can reduce the DRS effect. In effect, the amplifier is split into two parts and the net gain is accumulated through both sections, but the isolator reduces the DRS in half. Although this technique has been used for high gain EDFAs and in ring designs of Raman amplifiers, it increases the complexity and cost of the amplifier considerably due to the need for two additional WDMs and one isolator.

As shown from the attenuation curve for fibers in FIG. 1a, there are two low-loss windows for telecommunications. In the prior art, EDFA technology has been developed to make full use of the 1.5 μm window. Since Raman amplification can be obtained over the entire transparency range for optical fibers, Raman amplification can be applied to both the 1.3 μm and 1.5 μm windows. Because future communication applications will demand the broadest bandwidth available over the existing fiber base, to fully utilize optical fiber's bandwidth, it is desirable to have an amplifier which will use both telecommunications windows and operate with WDM simultaneously.

SUMMARY OF THE INVENTION

It is an object of the present invention to provide a Sagnac Raman amplifier and cascade laser which is operable in both 1.3 μm and 1.5 μm windows.

It is another object of the present invention to provide a broadband Sagnac Raman amplifier and cascade laser which is operable in both 1.3 μm and 1.5 μm windows.

It is another object of the present invention to provide a broadband pump for use in a broadband Sagnac Raman amplifier and cascade laser.

It is another object of the present invention to remove environment-sensitive elements from the cavity of the Sagnac Raman amplifier and cascade laser.

It is another object of the present invention to provide a polarization independent Sagnac Raman amplifier and cascade laser.

It is another object of the present invention to improve noise performance of the Sagnac Raman amplifier and cascade laser.

It is yet another object of the present invention to provide a parallel optical amplification apparatus having a combination of the Sagnac Raman amplifier and EDFA for the 1.3 μm and 1.5 μm low-loss windows of optical fibers.

The present invention attacks the intensity fluctuation problem with Raman amplifiers by recognizing that higher order intensity fluctuations are a distributed effect (everywhere present in the distributed gain medium that produces the optical signal gain) that can be significantly reduced by a reflector structure that rejects intensity fluctuations originating in this distributed effect. The present invention employs a reflector structure that defines two optical paths within the distributed gain medium, configured to support both common mode and difference mode optical signals. By choosing a configuration that propagates higher order intensity fluctuations in the difference mode, much of the unwanted amplification of pump fluctuations is rejected.

Although numerous configurations are possible, one embodiment employs a Sagnac interferometer as one of the two optical resonator reflectors. The Sagnac interferometer employs an optical coupler with both ends of a fiber loop (a distributed gain medium) connected to its light splitting ports. The coupler thus establishes two optical paths, a clockwise path and a counterclockwise path. Signals are compared at this optical coupler, with common mode signals being substantially reflected and difference mode signals being at least partially rejected through a rejection port associated with the optical coupler. Although intensity fluctuations originating at the pump (at the pump wavelength) are amplified, any intensity fluctuations resulting from higher order stimulation of the distributed gain medium are at least partially rejected as difference mode signals.

This specification describes inventions leading to a broadband Raman amplification that would be compatible with WDM technologies. Four improvements over the original Sagnac Raman amplifier and laser are discussed.

First, broad bandwidth is achieved by using a broadband laser or amplifier cavity combined with a broadband pump. The broadband pump has a pump laser and a bandwidth adding mirror connected thereto to generate a broadened pump spectrum. The bandwidth adding mirror can be a Sagnac loop mirror with an unequal ratio coupler. It further has a phase/amplitude modulator asymmetrically located within the Sagnac loop mirror. The pump laser is a cladding pumped fiber laser. In one preferred embodiment, the broadband pump is incorporated directly into the laser or amplifier cavity.

Second, turn-key operation is obtained by minimizing the need for polarization controllers through use of a polarization maintaining cavity. In one embodiment, the Sagnac loop mirror of the broadband Sagnac Raman amplifier is fabricated from polarization maintaining fiber cross-spliced at the middle of the loop mirror. In another embodiment, the Sagnac loop mirror is made of polarization maintaining fiber and the Raman gain fiber is separated from the Sagnac loop mirror. Input and output ports of the amplifier are polarization maintaining WDMs.

Third, the noise performance is improved and protection against double Rayleigh scattering is provided by using a polarization diversity pumping system. In one embodiment of the polarization diversity pumping system, the pumping light is launched at a 45 degree angle into the polarization maintaining fiber to produce a beam having two polarization directions. Such angle is achieved by either rotating the fiber or using a quarter wavelength plate. In another embodiment, the pumping light is first divided by a 50:50 coupler into two beams. One beam travels through a retarder to change its polarization direction. Then a polarization beam splitter combines the two beams In yet another embodiment, the polarization maintaining fiber is spliced at a 45 degree angle to the cladding-pumped fiber to output a beam having two polarization directions.

Finally, two-wavelength operation is achieved between two parallel amplifiers for two separate windows. In one embodiment, both 1310 nm and 1550 nm amplifications are performed by the broadband Sagnac Raman amplifiers. Moreover, the two amplifiers share a common pump laser. In another embodiment, a combination of Raman amplifiers and EDFAs are used. The Sagnac Raman amplifier is used to amplify the 1310 nm signal, while the 1550 nm signal is amplified by the EDFA. The EDFA may be pumped by another Sagnac Raman cascade laser.

For a more complete understanding of the invention, its objects and advantages, reference may be had to the following specification and to the accompanying drawings.

BRIEF DESCRIPTION OF THE DRAWINGS

FIG. 7b depicts in detail the Fabry-Perot filter employed in the embodiment of FIG. 7a.

DESCRIPTION OF THE PREFERRED EMBODIMENTS

The present invention provides a structure that combines Sagnac interferometer technology with Raman amplifier technology to achieve performance improvements that neither technology, by itself, has heretofore been able to deliver. More specifically, the preferred embodiments relates to broadband Sagnac Raman amplifiers and lasers that have substantially improved bandwidth and noise performance. To provide a better understanding of the amplification mechanism at work in the present invention, some knowledge of the Raman effect will be helpful.

1. Stimulated Raman Scattering

Figure 1A:
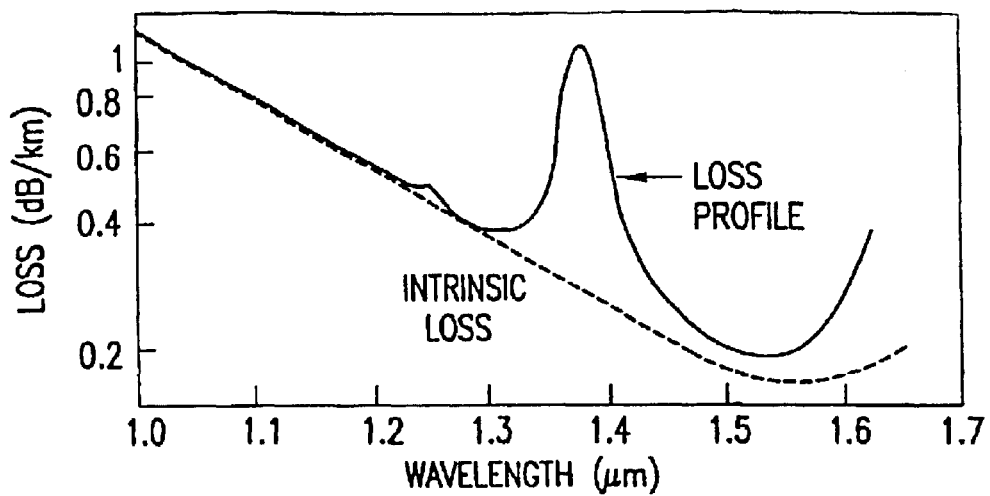
FIG. 1a is a graph of the loss or attenuation in typical single-mode optical fibers. The solid curve is a measured loss profile, and the dashed curve shows the intrinsic loss profile resulting from Rayleigh scattering and absorption in pure silica.
Figure 1B:
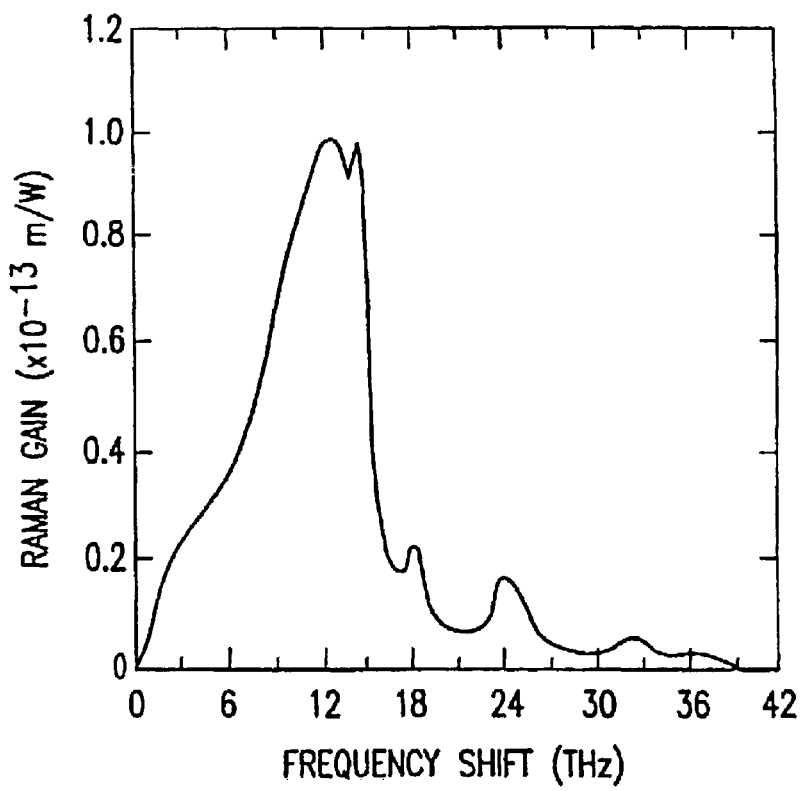
FIG. 1b is a graph depicting Raman gain as a function of frequency shift for fused silica at a pump wavelength of 1 .μm.

Stimulated Raman scattering is an important nonlinear process that can turn optical fibers into amplifiers and tunable lasers. Raman gain results from the interaction of intense light with optical phonons in the glass, and the Raman effect leads to a transfer of energy from one optical beam (the pump) to another optical beam (the signal). An interesting property of Raman gain is that the signal is downshifted in frequency (upshifted in wavelength) by an amount determined by the vibrational modes of the glass. FIG. 1b depicts the Raman gain coefficient $g_r$ for silica fibers. Notably, the gain $g_r$ extends over a large frequency range (up to 40 terahertz [THz]), with a broad peak centered at 13.2 THz (corresponding to a wavelength of 440 cm$^{-1}$). This broad behavior is due to the amorphous nature of the silica glass and means that the Raman effect can be used to make broadband amplifiers. The Raman gain depends on the composition of the fiber core and can vary with different dopant concentrations.

The present invention employs a distributed gain medium comprising a material that produces optical signal gain due to third order nonlinearities in the material, in which the gain is proportional to the intensity of the light passing through the medium. By way of background, the response of any dielectric to light becomes nonlinear for intense electromagnetic fields, and optical fibers are no exception. This nonlinear response is related to anharmonic motion of bound electrons under the influence of an applied field. The induced polarization P from the electric dipoles is not linear in the electric field E. Rather, it satisfies the more general relationship described in equation (1)

$$P = \epsilon_0 [\chi^{(1)} E + \chi^{(2)} : EE + \chi^{(3)} : EEE \ldots ] \quad (1)$$

where $\epsilon_0$ is the vacuum permitivity and $\chi^{(j)}$ (j=1,2 . . . ) is the jth order susceptibility. To account for the light polarization effects, $\chi^{(j)}$ is a tensor of rank j+1. The linear susceptibility $\chi^{(j)}$ represents the dominant contribution to P. Its effects are included through the refractive index n and the attenuation coefficient a. The second order susceptibility $\chi^{(2)}$ is responsible for such nonlinear effects as second harmonic generation and sum-frequency generation. However, this second order susceptibility is nonzero only for media that lack an inversion symmetry at the molecular level. Since silicon dioxide is a symmetric molecule, $\chi^{(2)}$ vanishes for silica glasses. As a result, optical fibers do not normally exhibit second order nonlinear effects. Nevertheless, dopants introduced inside the fiber core can contribute to second harmonic generation under certain conditions.

The third order susceptibility $\chi^{(3)}$, which is responsible for phenomena such as third harmonic generation, four-wave mixing and nonlinear refraction, is present in optical fibers. It is this third order nonlinearity that is operative in the present invention. These third order nonlinear effects are identifiable as being variable in proportion to the intensity of the light.

From a functional standpoint, stimulated Raman scattering amplifiers can be pumped at any wavelength because there is no pump absorption band, while the signal gain characteristics are determined by the optical phonon spectra. This means that stimulated Raman scattering amplifiers are capable of cascading to higher Raman orders or longer wavelengths. Cascading is the mechanism by which optical energy at the pump wavelength is transferred, through a series of nonlinear polarizations, to an optical signal at the longer signal wavelength. Each nonlinear polarization of the dielectric produces a molecular vibrational state corresponding to a wavelength that is offset from the wavelength of the light that produced the stimulation. The nonlinear polarization effect is distributed throughout the dielectric, resulting in a cascading series of wavelength shifts as energy at one wavelength excites a vibrational mode that produces light at a longer wavelength. This process can cascade through numerous orders. The ability to cascade makes stimulated Raman scattering amplifiers very attractive, for it allows operation over a wide range of different wavelengths.

Hence, Raman amplification has a number of attractive features. First, Raman gain exists in every fiber; Raman gain is a good candidate for upgrading existing fiber optic links. Second, unlike EDFAs, there is no excessive loss in the absence of pump power, an important consideration for system reliability. Third, the gain spectrum is very broad (bandwidth of greater than 5 THz around the peak at 13.2 THz), so that it can be used to amplify multiple wavelengths (as in wavelength division multiplexing) or short optical pulses. Also, Raman amplification can be used for distributed amplification, which may be especially valuable for ultra-high-bit-rate systems. Finally, by varying the pump wavelength or by using cascaded orders of Raman gain, the gain can be provided over the entire telecommunications window between 1.3 $\mu$m and 1.6 $\mu$m.

2. Embodiments of Sagnac Raman Amplifiers

Figure 2:
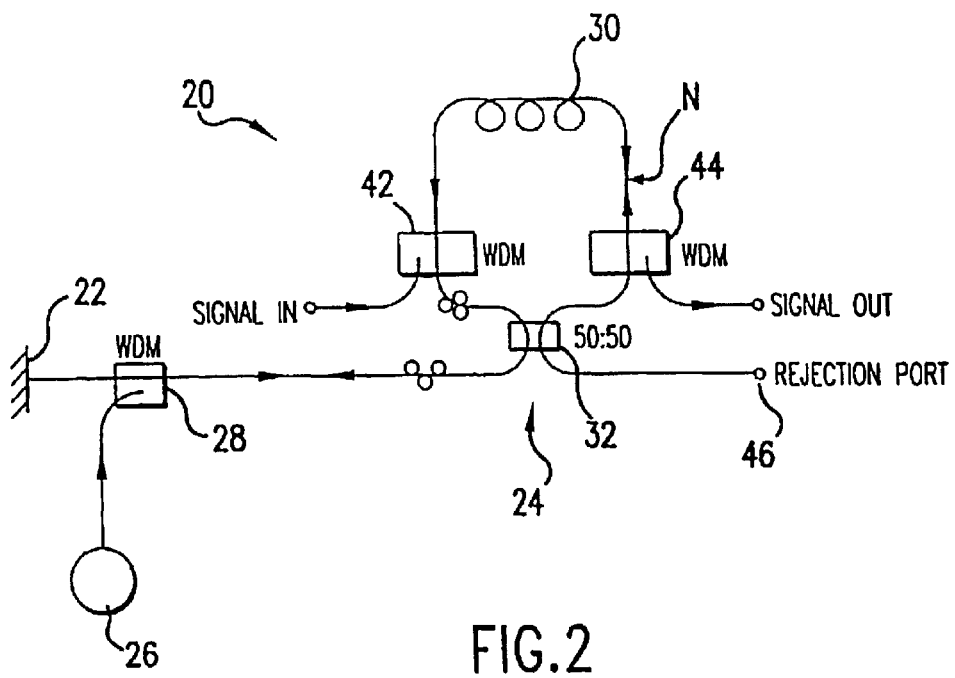
FIG. 2 is a diagrammatic illustration of a first embodiment of a Sagnac Raman amplifier in accordance with the present invention.

FIG. 2 illustrates a first embodiment of the Sagnac Raman amplifier 20 that comprises at least two reflectors 22, 24 and a port 28 for coupling to a source of light. Specifically, reflector 22 may be any reflective structure such as a mirror. Reflector 24 is a loop reflector such as a Sagnac interferometer. In this embodiment, these two reflectors form therebetween an optical resonator. The light source 26 is a pumped fiber laser coupled through a WDM port 28 to the optical resonator. An optical signal is injected into the optical resonator and this signal is then amplified by the optical energy introduced by the light source 26. An optical signal input WDM port 42 is provided to allow the optical resonator to be used as an optical amplifier. The optical signal then exits from an optical signal output WDM port 44.

The light source 26 can be any suitable source of optical energy. Because the Raman effect relies upon intense optical energy, high power semiconductor or cladding-pumped fiber lasers are presently preferred. A suitable high power source is available from Spectra Diode Lasers, Inc., San Jose, Calif. The wavelength of the optical energy from light source 26 will, of course, be chosen to match the desired application. By way of example, in an embodiment designed for 1.3 $\mu$m telecommunication applications, the light source 26 provides light at a wavelength of 1117 nm. This light is introduced through the wavelength division multiplexing (WDM) coupler 28. The optical signal to be amplified, injected through WDM coupler 42, may be at a wavelength of 1300 nm to 1310 nm. The injected signal propagates in the clockwise direction around loop 30 and is then removed using WDM coupler 44. Due to the frequency downshift (wavelength upshift) of the Raman effect, the wavelength of the light source 26 is upshifted to match that of the signal. Although a 1.3 µm amplifier example is presented here, the configuration illustrated in FIG. 2 and the embodiments described elsewhere in this specification can be configured to work at other wavelengths as well. Thus the light source 26 can be any suitable wavelength to match the application (not necessarily at 1117 nm) and the two WDM couplers 42 and 44 can be designed for any desired signal wavelengths (not necessarily between 1300 nm and 1310 nm).

The resonant cavity of the embodiment illustrated in FIG. 2 lies between reflector 22 and reflector 24. In the illustrated embodiment the optical fiber disposed between these two reflectors serves as the light transmissive medium. The Sagnac reflector 24 is fabricated using a distributed gain medium comprising a material that produces optical signal gain through third order nonlinearities in the material, characterized by a gain that is proportional to the intensity of the light passing through the medium. Although reflector 22 is shown as a discrete mirror in the embodiment, it will be appreciated that reflector 22 could be any form of reflector, including a simple metallic coating evaporated onto the fiber end. Thus the invention can be implemented as an all fiber configuration. Some of the embodiments yet to be described use other forms of reflectors for reflector 22.

The Sagnac interferometer that serves as reflector 24 is fabricated from a length of optical fiber that may be suitably coiled to accommodate the physical packaging requirements. The Sagnac interferometer comprises a fiber loop 30, typically a kilometer or more in length. The fiber loop is established using a coupler such as 50:50 coupler 32. The 50:50 coupler defines two signal paths, such that half of the light from light source 26 travels around loop 30 in a clockwise direction and half of the light from light source 26 travels around loop 30 in a counterclockwise direction. These two optical paths support both common mode and difference mode optical signals. To illustrate, assume that a continuous wave burst of light is injected via WDM 28 from light source 26. The CW burst enters the Sagnac reflector 24; half of the energy propagates in a clockwise direction and half of the energy propagates in a counterclockwise direction. After propagating through the Sagnac reflector, the continuous wave burst is then reflected back in the direction of WDM 28, where the burst then reflects from reflector 22 and is again transmitted to the Sagnac reflector, where the cycle repeats. The CW burst thus resonates between the two reflectors 22 and 24, growing in energy at the resonant frequency. This is the common mode signal path. The system is designed to reflect the common mode signal between reflectors 22 and 24, whereby the optical amplification occurs.

Now consider a noise burst signal that originates at some random location along fiber loop 30. For purposes of the illustration, assume that the noise burst is injected at a location designated by N in FIG. 2. Some of the energy of the noise burst (that which propagates in the clockwise direction) passes out through rejection port 46 where it is not returned to the system. The remainder (propagating in the counterclockwise direction) is reflected within the system and therefore retained. Because the signal paths of the noise burst are unbalanced (difference mode), a portion of the noise burst energy (approximately half of the energy) is lost, thus lowering the noise level within the system. The noise burst originating in the fiber loop travels in a difference mode, in which one optical path is retained within the system and the other optical path is discharged through rejection port 46. This is how the invention is able to reduce higher order amplification of pump source fluctuation. The higher orders originate (through the Raman effect) within the fiber loop and are thus treated as difference mode signals.

One advantage of using the Sagnac reflector 24 is its inherent broadband properties. Unlike some other systems that are restricted by the laws of physics to operate at a single resonant frequency dictated by doping, the present invention operates over a broad range of frequencies, the operating frequency being dependent principally upon the frequency of the input signal. Of course, if desired, frequency-selective gratings or frequency-selective filters can be employed within the laser cavity if precise wavelength control is desired.

One significant advantage of the invention results from the union of the Sagnac loop mirror with the Raman amplifier technology. Conventionally, a large source of amplitude jitter in Raman lasers arises from the pump fluctuations that become greatly amplified in the highly nonlinear cascaded Raman process. Advantageously, the Sagnac loop mirror results in a quieter amplifier (and also a quieter laser) due to its difference mode noise rejection properties. The Sagnac loop tends to dampen noise at frequencies larger than the inverse round-trip time of the loop cavity. For example, for a 2 kilometer (km) long fiber loop, noise at frequencies larger than 100 kilohertz (kHz) will be partially rejected via the rejection port 46. Also, spurious signals and noise injected at some arbitrary point along the loop are also attenuated.

As previously noted, the Raman amplifier is capable of cascading through multiple orders. With each cascade order there is a corresponding shift in optical wavelength. The wavelength shift corresponds to a predetermined Stokes wavelength. Thus to achieve a 1310 nm signal wavelength four cascaded orders of Stokes shift would be employed, namely: 1117 nm to 1175 nm to 1240 nm to 1310 nm. Similarly, a fifth Stokes shift, based on the previous cascaded orders, would produce an output wavelength at 1480 nm.

Cascading is a desirable property; it allows the system designer to shift the pump wavelength to any number of different desired signal wavelengths. Thus commercially available, high-powered pumps can be wavelength shifted to match the wavelength of the signal being amplified. However, cascading comes at a price. Pump fluctuations are amplified combinatorially, as the examples of Table I demonstrate. Table I shows how a 10% intensity fluctuation at the pump cascades exponentially with each cascaded order. Table I compares two cases. Case 1 assumes a 10% fluctuation introduced in the first step, using a simple Fabry-Perot (linear) cavity so that there is no rejection of the fluctuation burst. Case 2 assumes a 10% fluctuation introduced in the second step, using a Sagnac Raman laser cavity with a 50% rejection of the fluctuation burst. Thus Case 2 shows the improvement achieved using the principles of the invention.

TABLE I

| | Case 1 Fluctuation | Case 2 Fluctuation |
|---|---|---|
| Initial Fluctuation | 10% | 10% |
| First Reflection from Sagnac Mirror | 10% | 5% |
| After First Stage (10x Gain) | 26% | 12% |
| After Second Stage (5x Gain) | 52% | 22% |
| After Third Stage (2.5x Gain) | 61% | 22% |

In the specific example illustrated in Table I we are considering only one noise burst, entered in the first step. The fluctuation is reduced to ⅓ by using the invention as is demonstrated by comparing the 61% fluctuation in Case 1 with the 22% in Case 2.

The values in Table I are based on the following model. Assume that the systems compared in both cases start with a pump and then cascade three orders (e.g., 1117 nm pump, cascade to 1175 nm, 1240 nm and then 1310 nm). We can specify the gain at each successive order to be ½ of the previous order. A gain in the first step of 10 dB=10× has been assumed. In this model the gain in the earlier stages is higher than in the later stages, because the earlier stages are robbed of power by the later stages during the cascading process. In general, the gain required at each stage for lasing is going to be such that the gain balances the loss. Thus, pumping higher orders corresponds to a loss and earlier stages must therefore have more gain. For simplicity, pump depletion and the resulting gain saturation have been neglected. Case 1 illustrates how a 10% noise fluctuation grows to a 61% fluctuation after three stages. Case 2 shows how that same noise fluctuation is amplified only 22% due to the 50% rejection in the Sagnac mirror for the higher stages. In Table I, note that the initial 10% fluctuation is reduced to 5% upon first reflection from the Sagnac mirror. This corresponds to 50% of the difference mode energy being rejected through the rejection port.

Figure 3A:
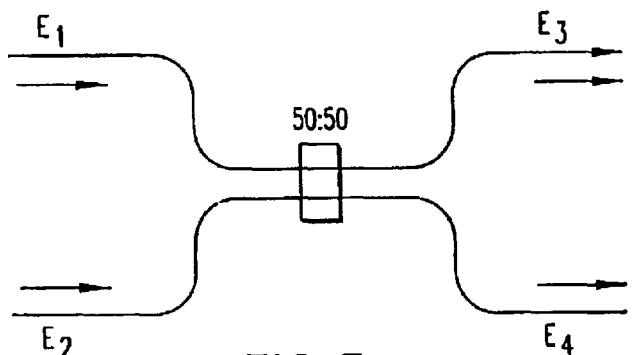
FIGS. 3a and 3b are illustrations that accompany the equations used to generate values presented in Table I.

The equations used to generate the values shown in Table I will now be described with reference to FIGS. 3A and 3B. In FIG. 3A two optical signal paths are shown being fed into and out from a 50:50 coupler. The input signals $E_1$ and $E_2$ produce output signals $E_3$ and $E_4$, respectively according to the following equations:

$$E_3 = \frac{1}{\sqrt{2}} E_1 + j \frac{1}{\sqrt{2}} E_2$$

$$E_4 = j \frac{1}{\sqrt{2}} E_1 + \frac{1}{\sqrt{2}} E_2$$

In the above equations $j = \sqrt{-1}$, corresponding to the phase of π/2+L. Propagation through a fiber of length L is given by the following expression:

$$E_i e^{j\phi},$$

in which φ corresponds to the following phase shift calculation:

$$\phi = 2 \frac{\pi}{\lambda} \cdot n \cdot L.$$

Figure 3B:
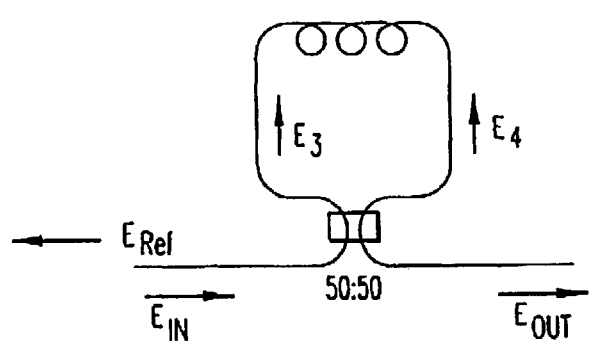

FIG. 3b shows the signal propagation within a Sagnac loop mirror that comprises a 50:50 coupler. The input electric field $E_{in}$ is split at the coupler, propagating in clockwise and counterclockwise directions, corresponding to electric fields $E_3$ and $E_4$. These fields are related to the input field $E_{in}$ according to the following equations:

$$E_3 = \frac{1}{\sqrt{2}} \cdot E_{in}$$

$$E_4 = j \frac{1}{\sqrt{2}} \cdot E_{in}$$

The effect of the Sagnac loop mirror is to produce a reflected field $E_{ref}$ that corresponds to the common mode of propagation, and to produce a rejected field $E_{out}$ that corresponds to the difference mode of propagation. The common mode and difference mode signals are thus described by the following equations:

$$E_{ref} = \frac{1}{2} j \{ E_{clockwise} + E_{counterclockwise} \} \rightarrow \text{common mode reflection}$$

$$E_{ref} = \frac{1}{2} j \{ E_{clockwise} + E_{counterclockwise} \} \rightarrow \text{difference mode reflection}$$

As the above Table shows, even a modest pump fluctuation (in this example a 10% fluctuation) is multiplied again and again through each cascaded order. This is why Raman amplifiers have not been considered generally useful in the past. However, the invention overcomes this problem by adopting a structure that places the distributed gain medium in a difference mode signal path, such that higher order pump fluctuations are at least partially rejected.

Figure 4:
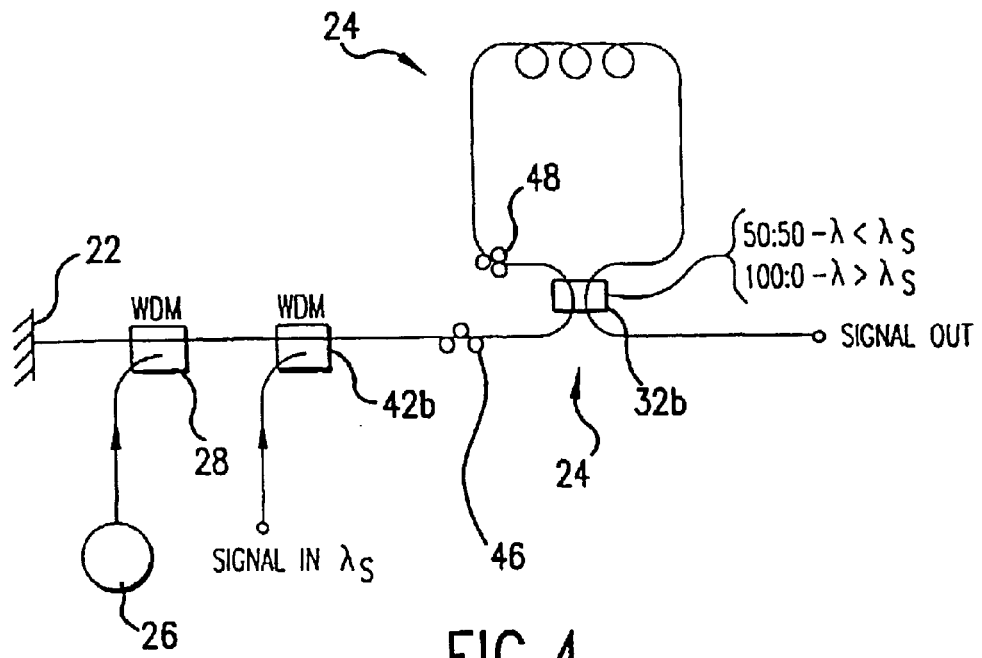
FIG. 4 is a diagrammatic illustration of a second embodiment of a Sagnac Raman amplifier of the present invention employing dichroic couplers for wavelength discrimination.

FIG. 4 shows a second embodiment of the invention. A resonant cavity is formed between reflector 22 and reflector 24. Reflector 24 is a Sagnac interferometer including a dichroic coupler 32b and a fiber loop. Dichroic coupler 32b is used to provide frequency selectivity. The dichroic coupler provides nominally 50:50 coupling over the cascade Raman order wavelengths, but a ratio that is closer to 100:0 for the signal wavelength. Thus, for a 1.3 μm system the 50:50 coupling would be provided for wavelengths less than 1300 nm and the 100:0 coupling would be provided for wavelengths greater than 1300 nm. The advantage of this configuration is that it is easier to make a balanced Sagnac interferometer, and the fiber in the Sagnac interferometer may be packaged more simply. One possible disadvantage of this configuration is that the dichroic coupler may be more difficult or expensive to implement. The signal input WDM port 42b is positioned in the cavity at a location between the two reflectors 22 and 24 and adjacent a WDM coupler 28. Polarization controllers 47 and 48 are used in the cavity and fiber loop, respectively. Polarization controllers may also be used in a similar fashion in the embodiment illustrated in FIG. 2.

Figure 5:
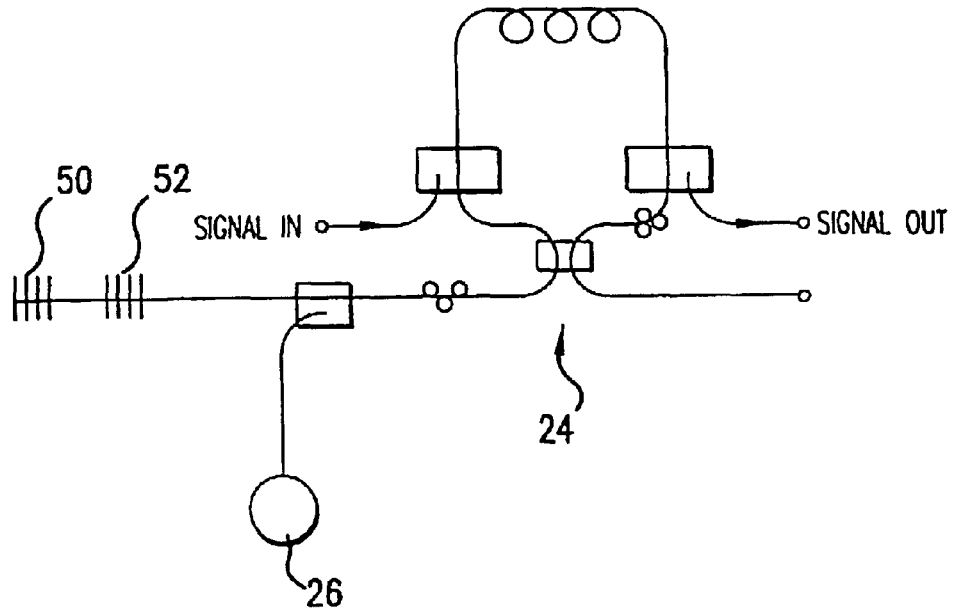
FIG. 5 is a diagrammatic illustration of a third embodiment of a Sagnac Raman amplifier of the present invention employing one or more grating reflectors.

FIG. 5 illustrates a third embodiment of the invention in which reflector 22 of FIG. 2 has been replaced by a series of grating reflectors 50 and 52. The grating filters may be selected to provide 100 percent reflection at selected wavelengths, such as at 1175 nm and 1240 nm. The advantage of the configuration of FIG. 5 is that a narrow pump line width can be achieved. The disadvantage is that the configuration is more complicated and more expensive to fabricate.

Figure 6:
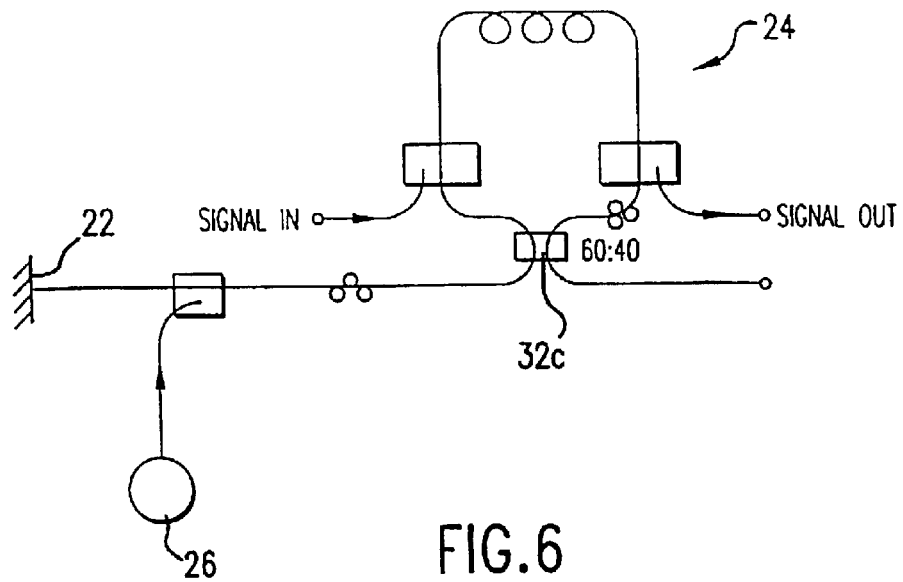
FIG. 6 is a diagrammatic illustration of a fourth embodiment of a Sagnac Raman amplifier of the present invention employing an uneven coupler.

FIG. 6 illustrates yet a fourth embodiment in which the Sagnac reflector 24 is constructed using a coupler 32c having an unequal coupling ratio, for instance 60:40. By unbalancing the Sagnac reflector the system will tend to further reject noise bursts that randomly occur in the loop.

This will serve to dampen out any mode locking or Q-switching tendencies. However, the unequal coupling leads to a leakage at various wavelengths, so that higher pump powers may be required to account for the reduced efficiency.

Figure 7A:
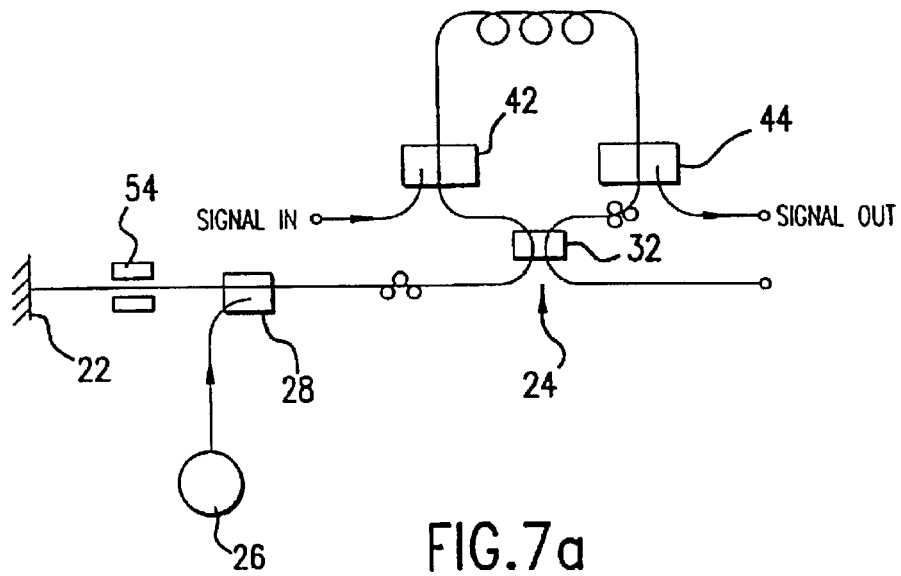
FIG. 7a is a diagrammatic illustration of a fifth embodiment of a Sagnac Raman amplifier of the present invention employing a Fabry-Perot filter.

FIG. 7a depicts a fifth embodiment of the invention which employs a Fabry-Perot wavelength filter 54 to narrowly select the Raman pump orders. In other respects the embodiment is the same as that of FIG. 2.

Figure 7B:
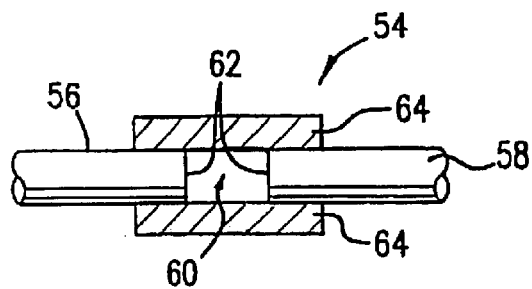

A detailed depiction of the Fabry-Perot filter is shown in FIG. 7b. The fiber is split into two segments 56 and 58 and separated to define an air gap 60. The cleaved ends of the fiber segments are coated at 62 with a nominally high selectivity coating (R>90%) at the wavelengths of interest. The cleaved faces are aligned parallel to each other and piezoelectric transducers 64 may be used to adjust the air gap width. Ideally, the air gap width L can be adjusted so the free-spectral range of the Fabry-Perot interferometer (Δf= c/2 nL) will match the reflection at the various Raman orders (spaced by Δf=13.2 THz). Thus a single Fabry-Perot interferometer can be used to replace the multiple gratings 50 and 52 of the FIG. 5 embodiment, because the transmission function is a periodic function of frequency. For example, for an air gap index n=1, the spacing should be 11.36 μm for Δf=13.2 THz. Alternatively, the spacing may be some integer multiple of this fundamental width. The fiber Fabry-Perot interferometer can also be replaced with a bulk interference filter, which can be rotated to adjust the peak transmission frequencies.

3. Embodiments of Sagnac Raman Cascade Lasers

The above embodiments focus on using the optical resonator of the invention as an optical amplifier. Thus in the preceding examples, a signal input port is provided into which the signal to be amplified is injected. However, the invention is not limited to amplifiers. The invention can also be used to develop cascade oscillators or cascade lasers. Various configurations are now described for constructing Sagnac Raman cascade lasers.

Figure 8:
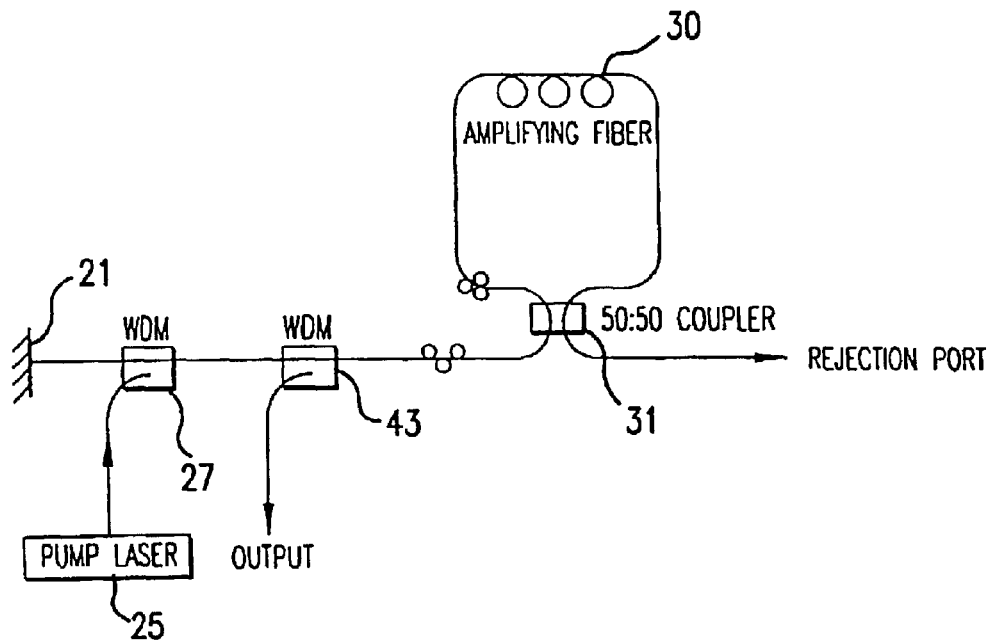
FIG. 8 is a diagrammatic illustration of a first embodiment of the Sagnac Raman cascade laser of the invention.

FIG. 8 illustrates a first embodiment of the Sagnac Raman cascade laser of the invention. In the laser, a fraction of the light at the desired wavelength is extracted from the cavity. The laser cavity comprises first and second reflectors 22, 24 wherein the second reflector is a Sagnac interferometer comprising a gain fiber 30 approximately 1 km long with enhanced Raman cross-section and a broad-band 50:50 coupler 31 at the base of the Sagnac gain fiber, and two wavelength-specific couplers 27 and 43 for bringing in the pump and removing the desired wavelength, respectively. A high-powered diode-array-cladding-pumped fiber laser 25 operating around 1.1 μm pumps the Sagnac Raman laser. This is chosen because commercial units with continuous wave powers approaching 10 W are available where the light launches directly into a single mode fiber. Then, a Sagnac cavity is used to permit the cascaded Raman process to downshift the pump at 1.1 μm to the communications bands around 1.3 μm (through a three-step cascade) or to 1.55 μm (through a six-step cascade).

The cascaded Raman process allows for large and varied wavelength shift between the pump and signal wavelengths. The novel Sagnac cavity design can dampen the noise fluctuations that would normally grow during the cascade process because the Sagnac mirror reflects common mode signals and dampens difference mode noise.

Figure 9:
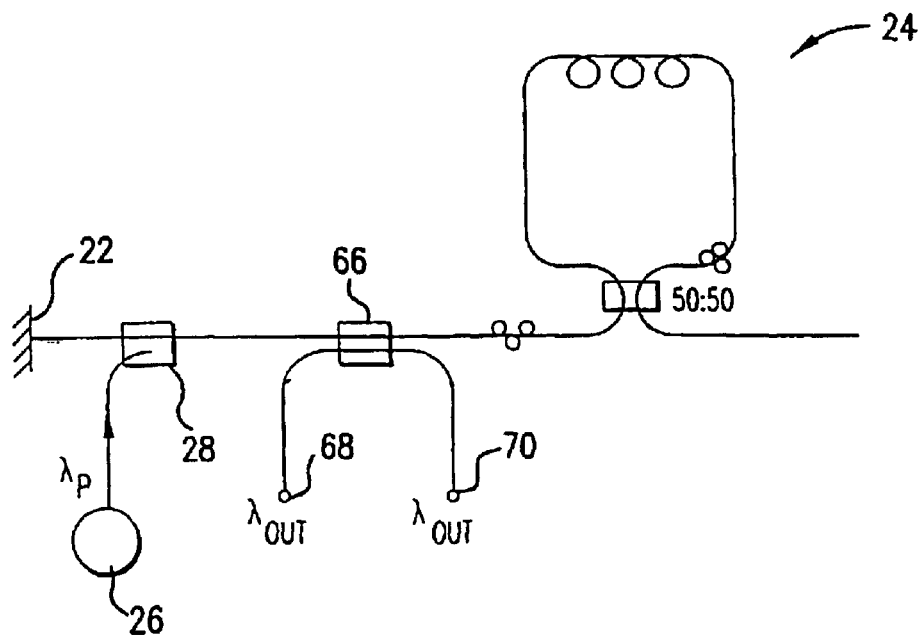
FIG. 9 is a diagrammatic illustration of a second embodiment of the Sagnac Raman cascade laser of the invention providing bidirectional output with a single coupler.

FIG. 9 illustrates a second embodiment of the Sagnac Raman cascade laser of the invention. This embodiment is the same as that of FIG. 8 but includes an intracavity coupler 66 that provides bidirectional outputs labeled $\lambda_{out}$. Advantageously, port 68 outputs a larger portion of the laser's total output than port 70 so the output at port 70 may be used for monitoring purposes.

Figure 10:
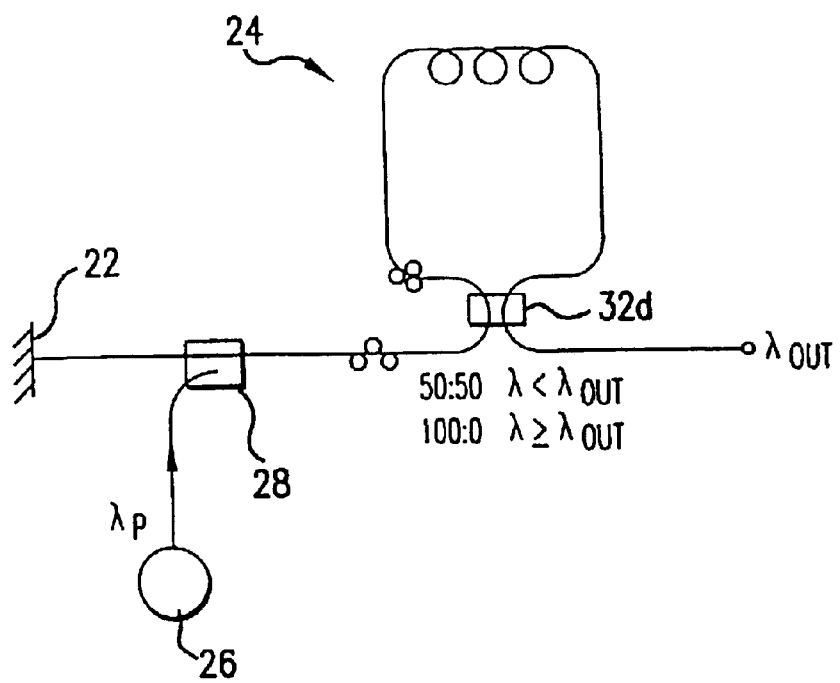
FIG. 10 is a diagrammatic illustration of a third embodiment of the Sagnac Raman cascade laser of the invention employing a dichroic coupler.

FIG. 10 illustrates a third embodiment of the Sagnac Raman cascade laser of the invention. This embodiment is the same as that of FIG. 8 but eliminates output coupler 43 by using a dichroic coupler 32d in the Sagnac loop mirror 24. The output of this oscillator $\lambda_{out}$ exits from the external cavity port of the Sagnac loop mirror 24. The dichroic coupler can be selected to provide 50:50 coupling over the cascade order and 100:0 coupling at the $\lambda_{out}$ wavelength.

Figure 11:
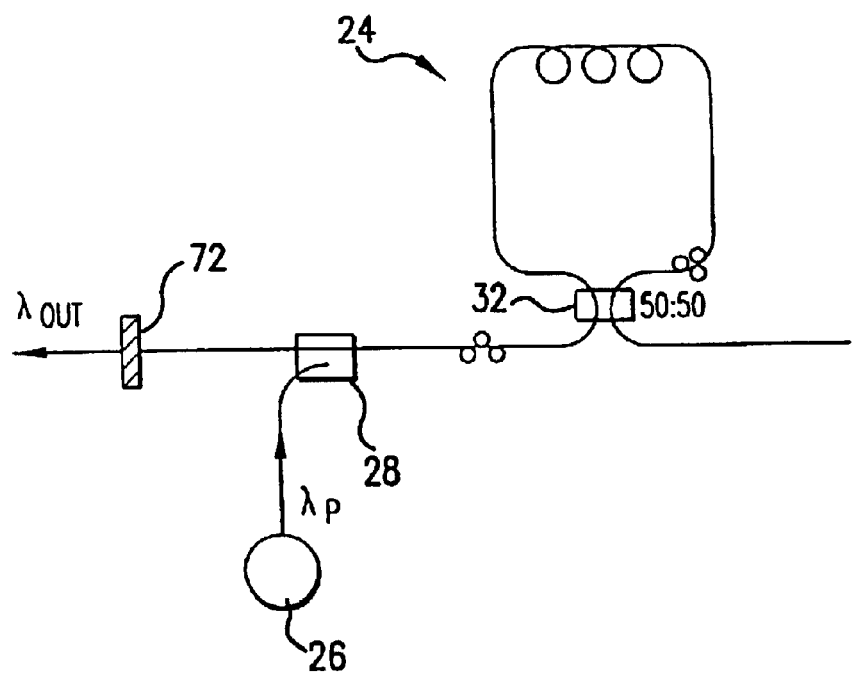
FIG. 11 is a diagrammatic illustration of a fourth embodiment of the Sagnac Raman cascade laser of the invention employing a dichroic mirror at the cavity end.

FIG. 11 shows a fourth embodiment of the Sagnac Raman cascade laser. This embodiment is the same as that of FIG. 8 but eliminates output coupler 43 by replacing mirror 22 with a dichroic mirror 72. Note that the dichroic mirror is reflective for cascade order wavelengths and is partially or completely transmitting for the $\lambda_{out}$ wavelength.

The Sagnac Raman cascade lasers described in the preceding examples (FIGS. 8–11) may be used in numerous applications, including upgrading existing fiber links, remote pumping of EDFAs, or other applications requiring different wavelengths of light. In this regard, the embodiments illustrated in FIGS. 8–11 are merely exemplary, and there may be other possible configurations employing the principles of the invention.

4. Broadband Raman Amplifiers Using Broadband Pumps

The basic idea to further broaden the bandwidth of the Sagnac Raman amplifier and cascade laser is to take advantage of the property of Raman amplification that the gain spectrum follows the pump spectrum so long as there is nothing in the Raman laser cavity to restrict the bandwidth. Raman laser schemes using either gratings or wavelength selective couplers cannot exploit this unique property of Raman amplification. Thus, the broadband cavity design of the Sagnac Raman amplifier and laser lends itself naturally to increased bandwidth by tailoring of the pump spectrum.

Figure 12:
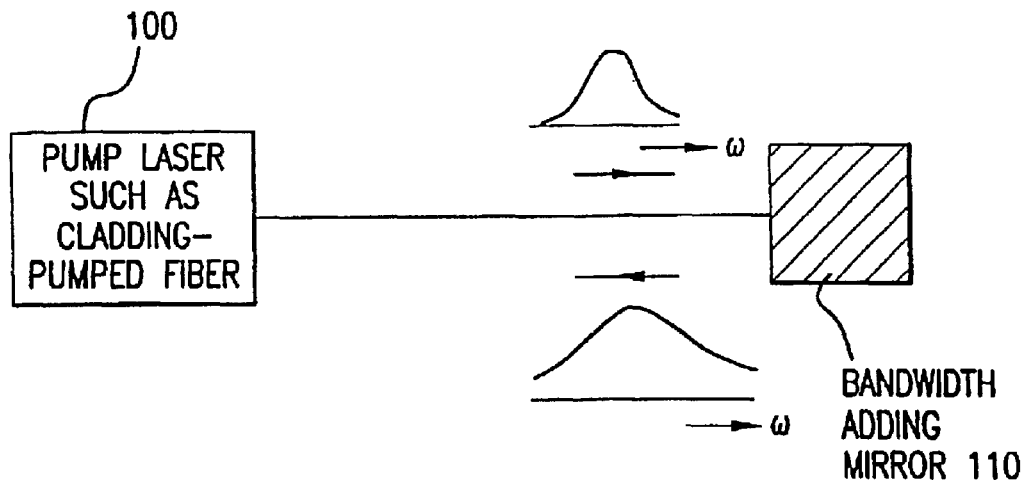
FIG. 12 illustrates the general principle of using a bandwidth adding mirror to a pump laser to broaden the bandwidth of the pump laser.

FIG. 12 illustrates a general principle to form a broadband pump. A bandwidth-adding mirror 110 is attached at the output end of a pump laser 100. The spectrum of the reflected signal is broader than the incident signal. Due to the nonlinear index-of-refraction in the fiber, the spectrum is broadened in the fiber through processes known as four-wave mixing or self-phase modulation.

A numerical example can help illustrate the spectral broadening possible through either four-wave mixing or self-phase modulation. For instance, assume that we use a length of the fiber that would be used in a Sagnac Raman laser or amplifier. Typical fiber parameters are as follows:

$A_{eff} = 15\ \mu m^2$ affective area $n_2/A_{eff} = 2 \times 10^{-9} W^{-1}$ effective nonlinearity L=l km The nonlinear phase shift in the fiber is given by $$\Delta \varphi = \delta k L = \frac{2\pi}{\lambda} L \frac{n_2}{A_{eff}} P.$$

Figure 13:
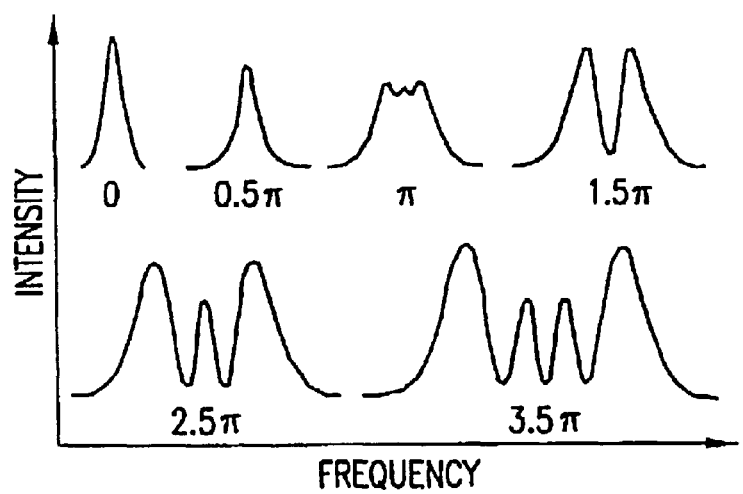
FIG. 13 depicts the spectral broadenings possible due to the nonlinearity in optical fibers.

Under the condition that the pump power in the fiber is 1 W at the wavelength of 1.1 μm, the resulting phase shift is Δφ=3.6π. FIG. 13 illustrates exemplary spectra resulting from self-phase modulation of Gaussian pulses, and similar spectral broadening can be expected from four-wave mixing. In particular, the calculated self-phase modulation spectra are shown for an unchirped Gaussian pulse. The spectra are labeled by maximum phase shift at the peak of the pulse (after R. H. Stolen and C. Lin, *Physical Review A*, Vol. 17, p. 1448, 1978). The spectral broadening factor is approximately given by the numerical value of the maximum phase shift. Therefore, in a single-pass transmission through the fiber, a spectral broadening of up to an order-of-magnitude might be expected. However, in closed loop operation in a laser cavity or oscillator, the spectral broadening will reach some steady-state value given by the counter-balance from spectral broadening and narrowing forces. Furthermore, such a large phase shift will not be achieved because the pump intensity is depleted by the various Raman Stokes orders.

Therefore, following on the concept of replacing wavelength restrictive gratings in the Raman amplifier with broadband Sagnac loop mirrors, to achieve a broadband pump it would be desirable to place a Sagnac mirror at the output of the cladding-pumped fiber laser. Moreover, it would also be desirous to have a reflective element on the cladding-pumped fiber laser that actually adds bandwidth to the laser. This could be achieved by using a long fiber length in the Sagnac loop mirror and utilizing the fiber nonlinearities, as described further below.

Figure 14A:
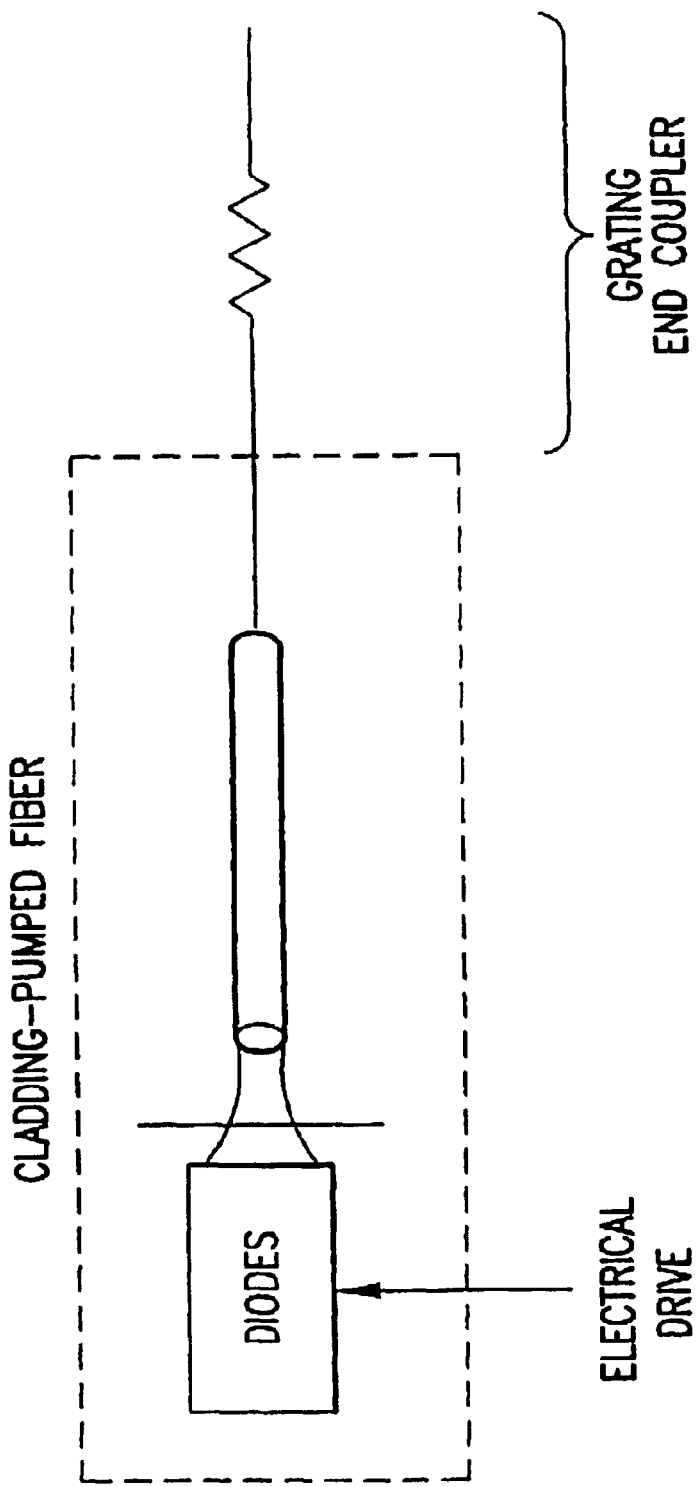
FIG. 14a depicts a prior art pump configuration where the wavelength of the pump laser is selected by placing a grating at the fiber output at the desired wavelength.
Figure 14B:
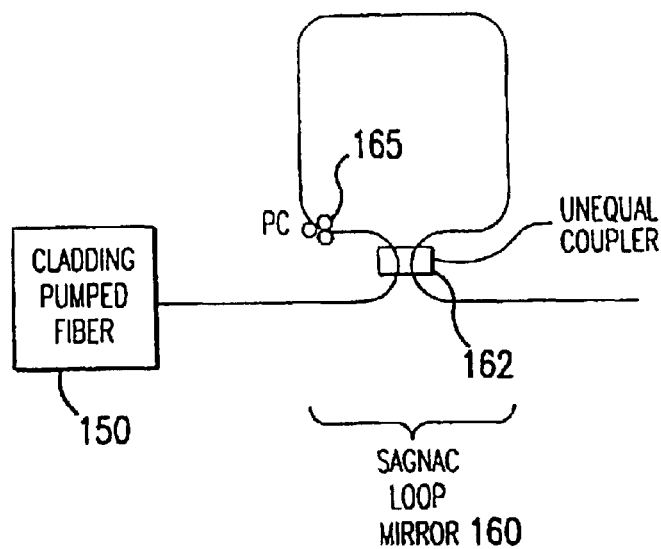
FIG. 14b is a diagrammatic illustration of a first embodiment of the broadband pump of the invention employing a Sagnac loop as the cavity end mirror.

FIG. 14b illustrates a first embodiment of the broadband pump in which a Sagnac loop mirror 160 is placed at the output of a cladding-pumped fiber laser 150. Since there are no reflective surfaces in the loop, the Sagnac mirror can handle the high powers from the cladding-pumped fiber laser without damage. As long as coupler 162 at the base of the loop is broadband, the reflectivity of the loop mirror can also be broadband. In addition, just as described for the Sagnac Raman amplifier and lasers above, the Sagnac loop provides some noise rejection properties. To permit partial transmission of the output, however, the loop mirror must be imbalanced in one of several ways. First, the coupler 162 at the base of the Sagnac loop can have a coupling ratio other than 50:50, which would lead to a certain amount of minimum leakage from the mirror. In particular, if the splitting ratio is (f:1−f) wherein $0 \leq f \leq 10.1$, then the reflection coefficient is $4f(1-f)$ and the transmission coefficient is $[1-4f(1-f)]$. Also, the unequal coupling will lead to an output associated with the fiber nonlinearities. Alternately, the loop can be imbalanced by using a polarization controller 165.

Figure 14C:
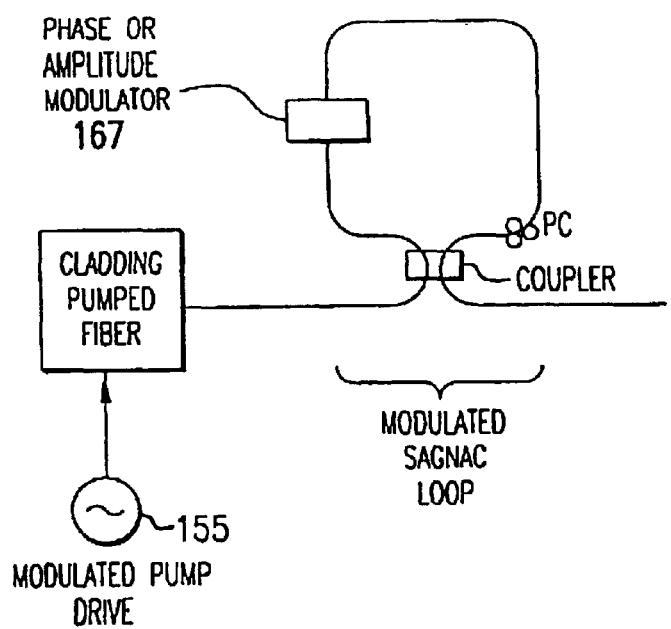
FIG. 14c is a diagrammatic illustration of a second embodiment of the broadband pump of the invention modulating either the Sagnac loop or the drive to the cladding-pumped fiber laser.

Inserting some sort of modulation in the cavity, thus adding sidebands to the spectrum, could further increase the bandwidth of the pump. FIG. 14c is a second embodiment of the broadband pump where the modulation is produced by a phase or amplitude modulator 167 inserted asymmetrically into the Sagnac loop mirror. Alternately, modulation might be applied to the drive for the pump laser 155. For example, the current drive to the diode lasers could be modulated, or different diodes could be excited as a function of time (i.e., excite one set of diodes alternately from another set). Finally, a mechanical modulation could be applied to the cladding-pumped fiber itself to perturb the longitudinal modes and lead to additional multi-mode bandwidth.

Figure 15A:
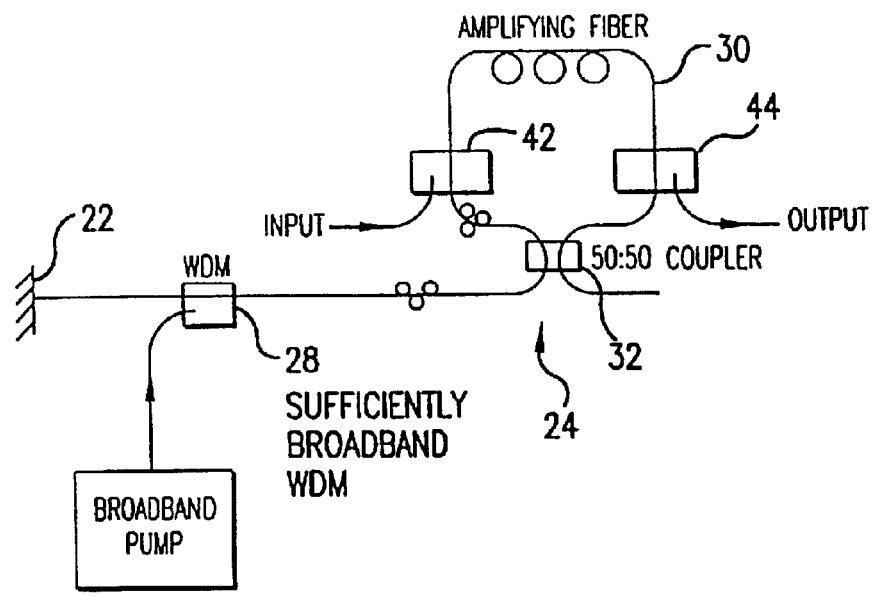
FIG. 15a is a diagrammatic illustration of a first embodiment of a broadband Sagnac Raman amplifier where the amplifier spectrum is broadened by using a broadened pump laser such as one of those of FIGS. 14b and 14c.

The broadband pump can be combined with the Sagnac Raman amplifier to obtain the desired broadband gain spectrum. FIG. 15a illustrates a first embodiment of the broadband Sagnac Raman amplifier of the invention that combines the embodiment described in FIG. 2 with the broadband pump of FIG. 14. By separating the Raman amplifier from the broadband pump, the bandwidth of each element can be individually optimized. The broadened bandwidth for the pump also increases the amount of pump power that can be injected into the cavity, since the limitations from stimulated Brillouin scattering will be reduced. The amplifier resonant cavity is formed between reflector 22 and reflector 24. Reflector 24 is a Sagnac interferometer including a coupler 32 and a fiber loop 30. An input WDM port 42 is used to input an optical signal. The optical signal then exits from an output WDM port 44. The WDM port 28 used to inject the pump, however, must not restrict the bandwidth of the pump light. That is, a sufficiently broadband WDM is required. The resulting bandwidth for the Raman gain should be the convolution of the pump spectrum with the spectrum from the Sagnac Raman amplifier. For example, if the pump spectrum is 10 nm wide and the Sagnac Raman amplifier spectrum is also 10 nm, the gain spectrum resulting from the configuration of FIG. 15a should be about 20 nm wide.

Figure 15B:
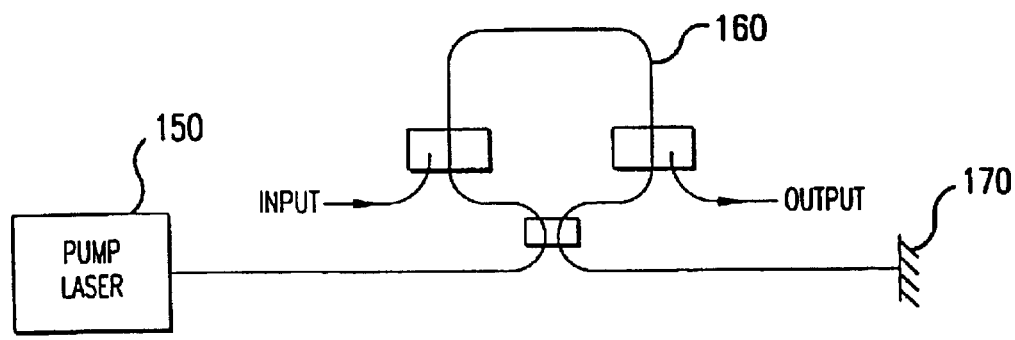
FIG. 15b is a diagrammatic illustration of a second embodiment of the broadband Sagnac Raman amplifier.

As an alternative from the configuration of FIG. 15a, FIG. 15b shows a second embodiment of the broadband Sagnac Raman amplifier in which a Sagnac mirror is used for both the pump linewidth broadening and the Raman amplification. Specifically, the Raman amplifier cavity is formed between the Sagnac mirror 160 and a reflector 170. A pump laser 150 is connected to the rejection port of the Sagnac mirror. Instead of using a WDM to introduce the pump light to the gain medium of the Sagnac Raman cavity, the Sagnac loop itself is used to bring in the pump light. The reflector 170 could be a mirror or other equivalents described earlier. The gain fiber of the Sagnac mirror is single mode not only at Raman order wavelengths but also at the pump wavelength, and the coupler at the base of the Sagnac mirror has similar characteristics for the pump and the Raman cascade orders.

Note that FIG. 15b is shown by way of example. Any of the amplifier cavities in FIGS. 2 and 4–7 or the laser cavities of FIGS. 8–11 can also take advantage of the pumping through the Sagnac configuration rather than using a separate WDM to bring in the pump light.

Figure 16A:
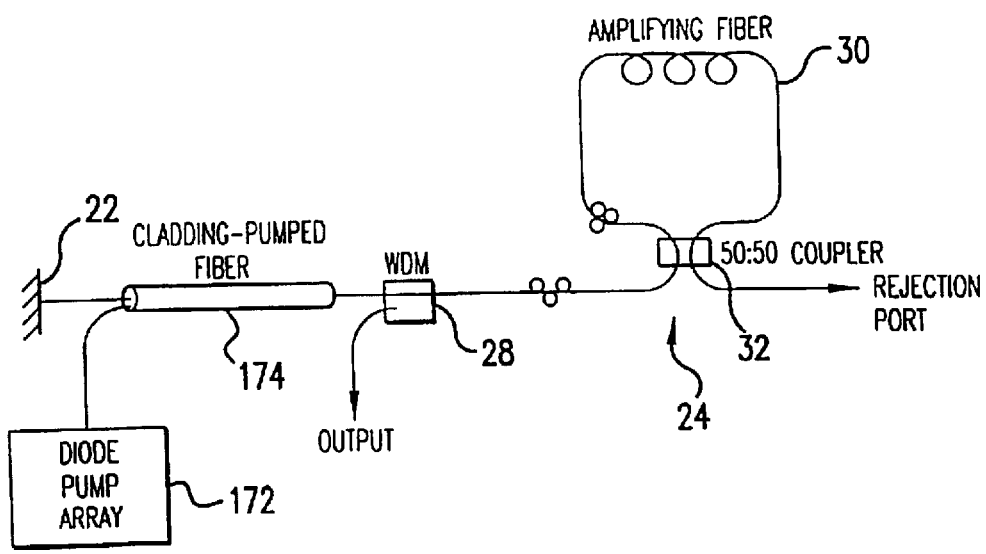
FIG. 16a is a diagrammatic illustration of a preferred embodiment of the broadband Sagnac Raman cascade laser combining the broadband pump with the Sagnac Raman cascade laser.
Figure 16B:
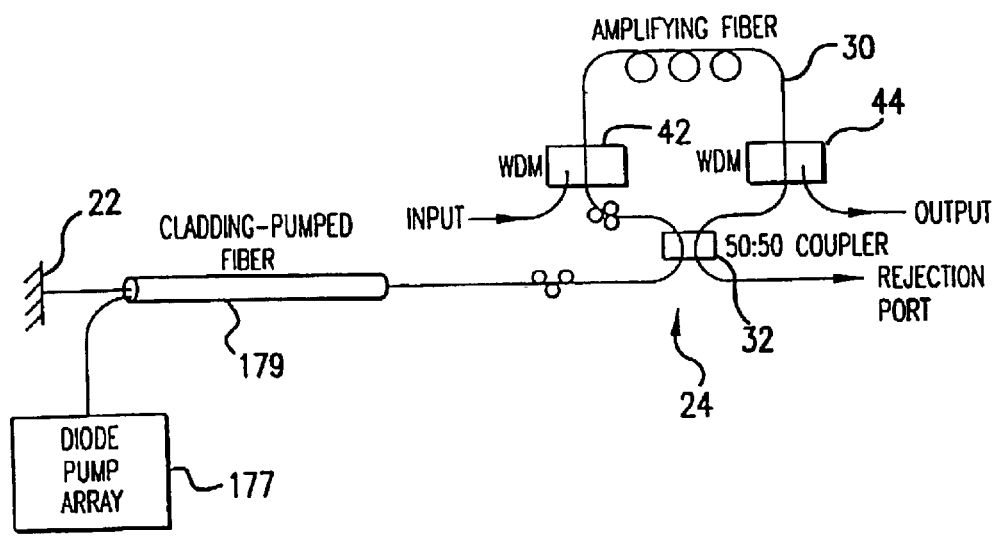
FIG. 16b is a diagrammatic illustration of a preferred embodiment of the broadband Sagnac Raman amplifier combining the broadband pump with the Sagnac Raman amplifier.

To accomplish the broadband pump through nonlinear spectral broadening and to achieve the broadband gain in the Sagnac Raman amplifier or laser, a more preferred embodiment is to combine configurations of the Sagnac Raman amplifier and cascade laser with the broadband pump. FIGS. 16a and 16b schematically illustrate respectively preferred embodiments of a broadband Sagnac Raman cascade laser and amplifier. The resonant cavity is formed between reflector 22 and reflector 24. Reflector 24 is a Sagnac interferometer including a coupler 32 and a fiber loop 30. An output WDM port 44 is used to exit an optical signal from the cavity. The 50:50 coupler 32 should have more-or-less flatband response over the spectral range from the pump wavelength to the signal or output wavelength. A cladding-pumped fiber 174 or 179 is placed between two reflectors 22 and 24. A diode-array pump 172 or 177 pumps the cladding-pumped fiber 174 or 179 respectively. The diode-array pump is introduced by using mirrors or lenses directly to one end of the fiber, or the fiber may have a dichroic mirror at the end and then the pump is injected through the end mirror. The cladding-pumped fiber generates a pumping light which subsequently pumps the fiber loop 30.

Such a cavity has the following advantages. First, broadband reflector plus spectral broadening from the fiber nonlinearities adds bandwidth at the pump wavelength. Second, there is a significant reduction in the number of components, hence a reduction in the manufacturing cost. Third, the pump laser and the Raman unit are combined into a smaller unit thereby making smaller packaging possible.

Figure 17:
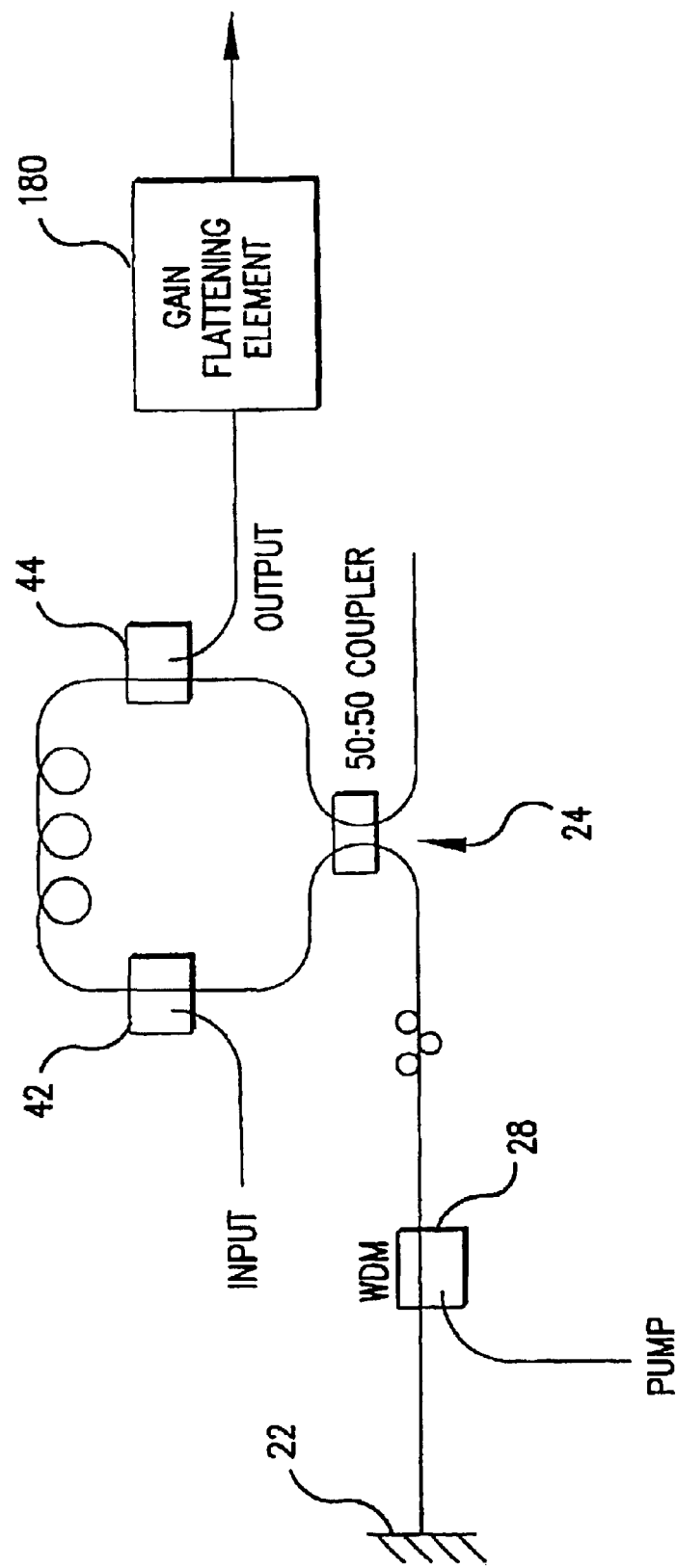
FIG. 17 is a diagrammatic illustration of the broadband Raman amplifier with a gain flattening element at the output.

One difficulty in implementing a WDM system using Raman amplifiers may be the wavelength dependent gain (see FIG. 1b). This wavelength dependency or nonuniformity of the gain band has little impact on single-channel transmission. However, it renders the amplifier unsuitable for multichannel operation through a cascade of amplifiers. As different wavelengths propagate through a chain of amplifiers, they accumulate increasing discrepancies between them in terms of gain and signal-to-noise ratio. However, using gain-flattening elements can significantly increase the usable bandwidth of a long chain of amplifiers. FIG. 17 shows that the Sagnac Raman amplifier in the above embodiments may be followed by such a gain flattening element 180 to provide gain equalization for different channels. Alternately, the gain flattening element could be introduced directly into the Sagnac interferometer loop.

Although several technologies have been proposed for gain equalization, to date the long period gratings appear to be the most promising candidates. Long period gratings are periodic structures formed in the core of a photosensitive optical fiber (c.f. S. K. Juma, Gain Flattening of EDFA for DWDM Systems, FiberOptic Product News, pp. 17–20, June 1997, or A. M. Vengsarkar, Long-period fiber gratings shape optical spectra, Laser Focus World, pp. 243–248, June 1996). Usually, the refractive index perturbations have a periodicity much greater than the wavelength of light, usually of the order of 200 to 400 microns, hence the long in the name. Special design algorithms and simulation tools exist for modeling the filter response of the gratings. These filter characteristics can then serve as a basis for fabricating a combination of gratings to achieve the desired filter response.

5. Broadband Sagnac Raman Amplifier and Cascade Laser Using Polarization Maintaining Fiber To obtain the broadest bandwidth from the Sagnac amplifier cavity, the wavelength-selective elements in the cavity must be minimized. Thus far, in the cavity designs of the Sagnac Raman amplifier and cascade laser, the polarization controllers (PC) still remain wavelength dependent. The best solution for the Sagnac Raman cavity is to remove the need for PCs entirely.

Figure 18A:
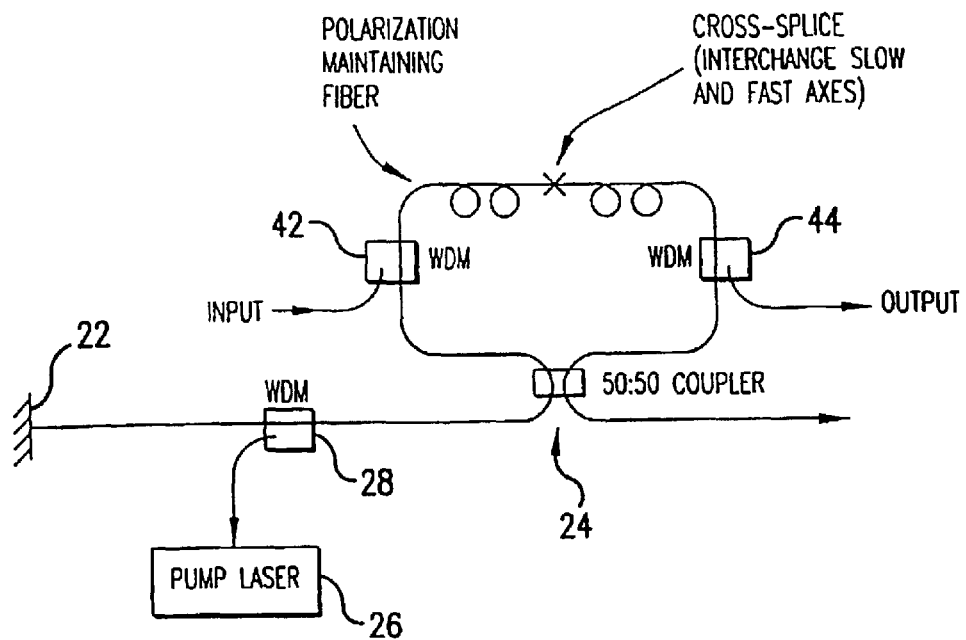
FIG. 18a is a diagrammatic illustration of one embodiment of a Sagnac Raman amplifier using an all-polarization-maintaining cavity.

One way of achieving this is to use an all-polarization-maintaining (PM) cavity. FIG. 18a illustrates such an all-PM Sagnac Raman cavity that requires PM fiber as well as PM WDMs and couplers. As is apparent, this embodiment is the same as that of FIG. 2 except that it uses PM fiber and PM WDMs and couplers. However, the PM fiber through which the signal travels might introduce polarization mode dispersion onto the channel. This can be avoided by mid-way through the cavity cross-splicing the fibers so the slow and fast axes are interchanged. Then, the second half of the cavity undoes the polarization mode dispersion in the first half of the cavity. If the polarization mode dispersion in half of the cavity causes too much signal degradation, then the cross-splicing can be done at more frequent intervals.

Figure 18B:
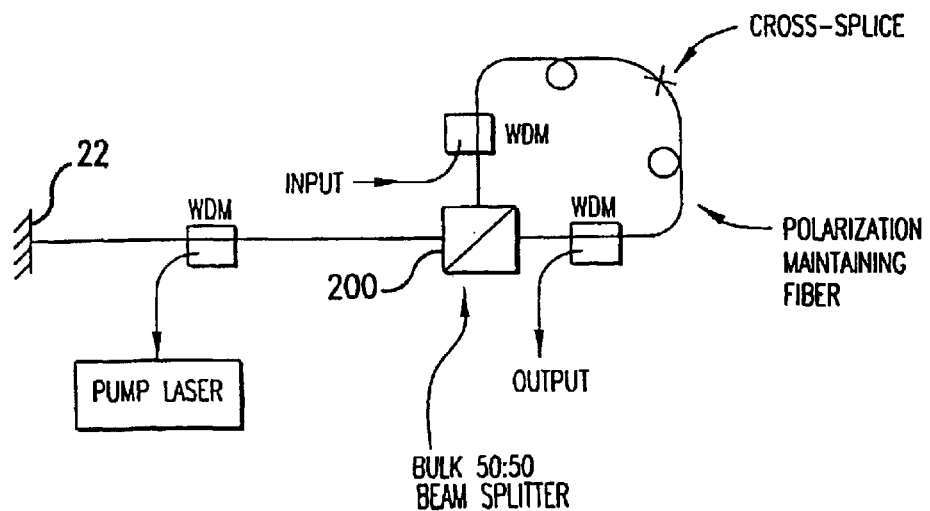
FIG. 18b illustrates an alternate embodiment of FIG. 18a using a bulk 50:50 beam splitter instead of the PM coupler.
Figure 19A:
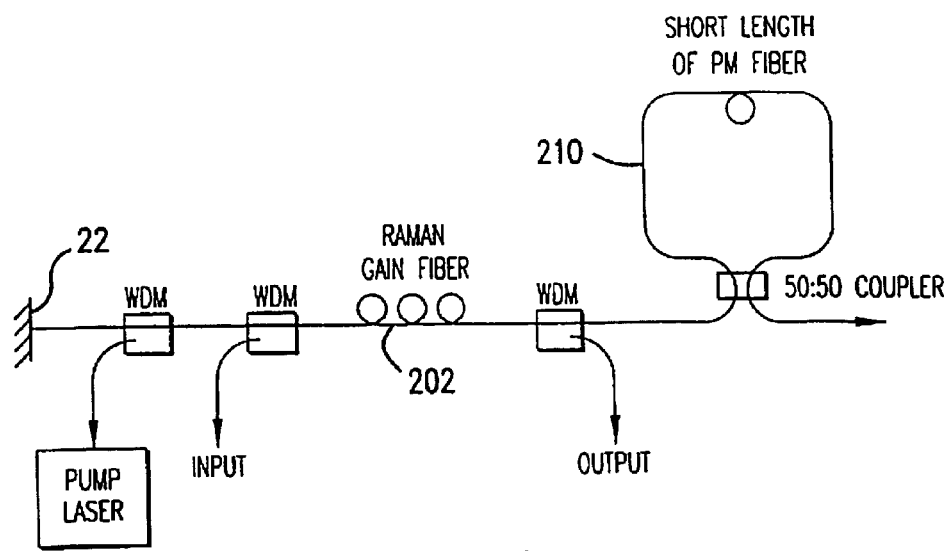
FIG. 19a is a diagrammatic illustration of an embodiment in which a Sagnac loop mirror made of a short length PM fiber is used.
Figure 19B:
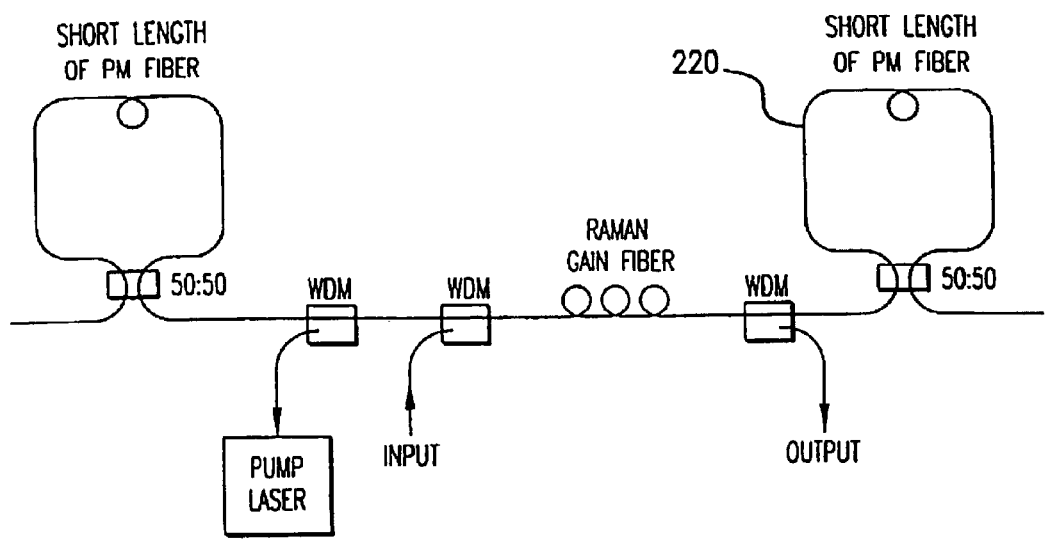
FIGS. 19b is a diagrammatic illustration of an embodiment in which two Sagnac loop mirrors made of a short length PM fiber are used.

Although the optimal cavity would use PM fiber and PM components, alternate cavity designs can be used if such fibers or components are either not available or too expensive. The embodiment of FIG. 18b has the same configuration as that of FIG. 18a except that it uses a bulk 50:50 beam splitter 200. On the other hand, if the gain fiber cannot be made PM while retaining the other desired qualities in terms of Raman gain, then cavities such as FIG. 19a or 19b can be used. In FIG. 19a, the cavity is formed between reflector 22 and a Sagnac loop mirror 210. The Sagnac loop mirror is made of a short length of standard or dispersion-shifted PM fiber. A Raman gain fiber 202 is placed in the middle of the cavity of the amplifier. Alternatively, two Sagnac loop mirrors are used as the two reflectors of the amplifier as depicted in FIG. 19b. Note that similar modifications can be made to the configurations of FIGS. 8–11, 15 or 16 as have been made in FIGS. 18a, 18b, 19a and 19b to the Sagnac Raman cavity shown in FIG. 2.

6. Noise Reduction through Polarization Diversity

The Sagnac Raman cavity design is also advantageous for reducing the deleterious effects of DRS. For example, at the 50:50 coupler 32 in FIG. 2 or 8, the pump power is split along the two directions. Since DRS is proportional to the pump intensity, this reduction in half of the power along each path reduces the DRS. Second, when the clockwise and counter-clockwise paths are combined interferometrically at the 50:50 coupler, the common mode signal will be reflected while the difference mode noise will be partially rejected. Hence, the rejection port 46 in FIG. 2 or 8 will also dampen the DRS.

An improvement on the Sagnac Raman amplifier design to further reduce the DRS is to use a polarization diversity pumping scheme. In such a scheme, the pump power is split between the two orthogonal polarizations of the fiber, reducing in half the power per polarization. In addition to reducing DRS, this pumping scheme will also produce gain from the Raman amplifier that is independent of the input signal polarization. This polarization independent gain property is highly desirable for most applications.

Figure 20A:
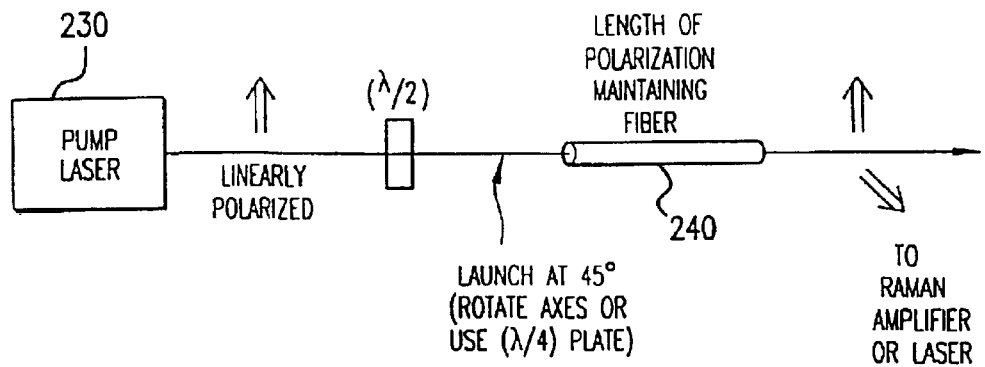
FIG. 20a is a diagrammatic illustration of a first embodiment for polarization diversity pumping of the Raman amplifier or laser in with the use of a length of polarization maintaining fiber.
Figure 20B:
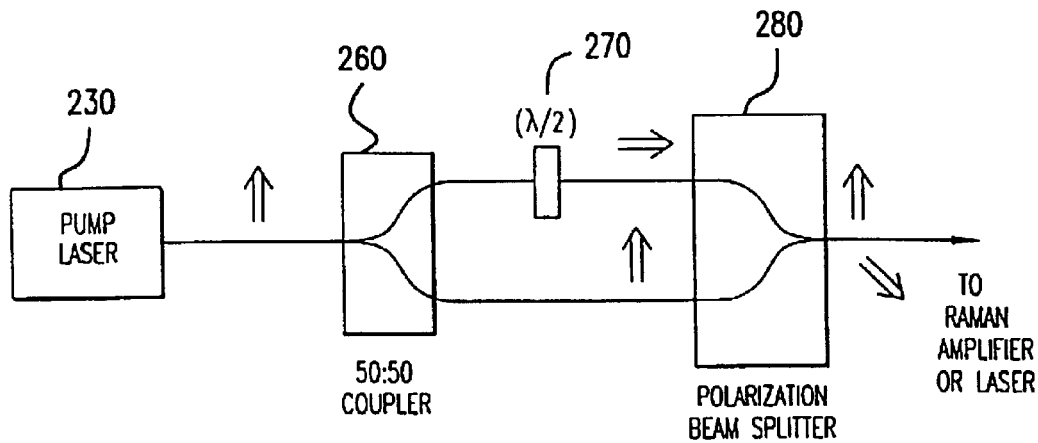
FIG. 20b is a diagrammatic illustration of a second embodiment for polarization diversity pumping of the Raman amplifier or laser with the use of two optical paths.

FIGS. 20a and 20b illustrate two embodiments of techniques to create the polarization diversity pumping. A pump laser 230, such as the cladding-pumped fiber laser, is normally linearly polarized. As depicted in FIG. 20a, pump laser 230 is coupled to a length of polarization maintaining fiber 240, where the light is coupled at 45 degrees to the fiber axes, and the birefringence of the PM fiber splits the two polarizations. The fiber can be rotated to accommodate the launch angle, or a quarter or half-wave retarder 250 can be used at the entrance end of the PM fiber to adjust the polarization. Alternately, as shown in FIG. 20b, a 50:50 coupler 260 is used to split the pump light into two beams. The polarization of one of the beams is then rotated by a quarter or half-wave retarder 270, and the two beams are then combined using a polarization beam splitter 280. Once separated along two axes, the pump light is then delivered to the Raman amplifier or laser configurations.

The polarization diversity scheme can be combined with other improvements disclosed earlier in the specification. For example, if an all-PM cavity is used as described in FIGS. 18a, 18b, 19a and 19b, then the linearly polarized pump light is adjusted to be launched at 45 degrees to the fiber principal axes. Alternately, if the integrated pump and Sagnac Raman amplifier is used as described in FIGS. 16a and 16b, then the axis of the cladding-pumped fiber 174 or 179 can be spliced at 45 degrees to the remainder of the cavity.

Figure 21:
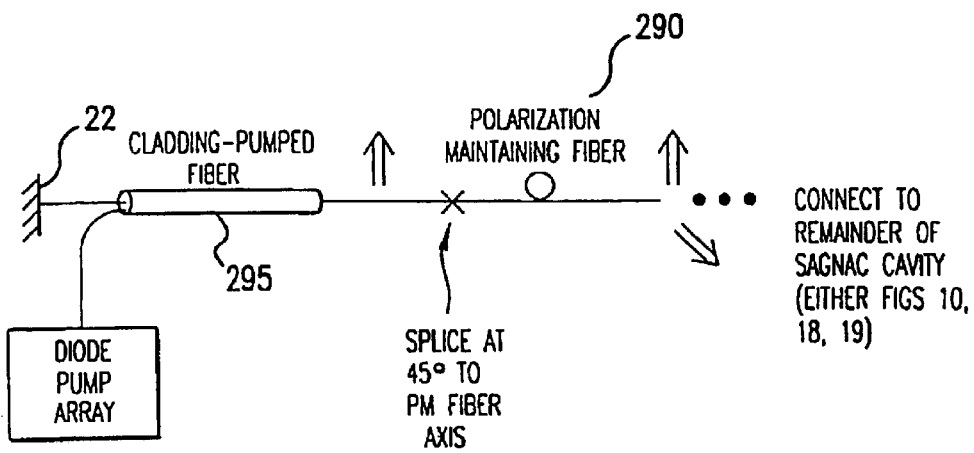
FIG. 21 illustrates one embodiment of the combined pump laser and Sagnac Raman amplifier cavity for polarization diversity pumping.

FIG. 21 shows an embodiment of the polarization diversity pumping system of the invention in which a length of PM fiber 290 is inserted after a cladding-pumped fiber 295. In particular, the axis of the cladding-pumped fiber is spliced at 45 degrees to the fiber axis of the PM Sagnac loop. Alternately, a polarization maintaining fiber is inserted if the Sagnac loop is not polarization maintaining.

7. Two-Wavelength Amplifiers

Raman amplifiers as described herein can provide the necessary element of two-wavelength, broadband amplification. To illustrate the various orders of Raman amplification that can be involved in the amplification process, Table II provides exemplary cascade orders for Raman amplification of signals at either 1310 nm or 1550 nm. The pump is assumed to be a cladding-pumped fiber laser, which can be tuned to operate at 1100 nm or 1117 nm. Amplification of a signal at 1310 nm involves three cascaded Raman orders, while a signal at 1550 nm involves six cascaded Raman orders. However, the criteria for using such a device is that there should not be any degradation of the performance at 1550 nm when adding the window at 1310 nm, or vice versa.

TABLE II

EXEMPLARY CASCADE ORDERS FOR RAMAN AMPLIFICATION
(Peak Raman Gain at 13.2 THZ)

(a) 1310 nm amplification

| $\lambda p$: | 117 nm—pump | } wavelength from pump to two |
| --- | --- | --- |
| 1st: | 1175 nm | } Raman orders below signal |
| 2nd: | 1240 nm | } One Raman order below signal |
| 3rd: | 1310 nm—signal | |

(b) 1550 nm amplification

| $\lambda p$: | 1100 nm—pump | } wavelength from pump to two |
| --- | --- | --- |
| 1st: | 1155 nm | } Raman orders below signal |
| 2nd: | 1218 nm | } |
| 3rd: | 1288 nm | } |
| 4th: | 1366 nm | } |
| 5th: | 1455 nm | } One Raman order below signal |
| 6th: | 1550 nm—signal | |

There are several physical effects that should permit simultaneous support of signals at 1310 nm and 1550 nm. First, as illustrated in Table II, the amplification of 1310 nm signals requires three cascaded orders of Raman gain, while the amplification of 1550 nm signals requires six cascaded orders. Since there are at least two intermediate orders of Raman gain in the cascade, the Raman gain or cross-talk penalty between signals at 1310 $\mu$m and 1550 $\mu$m should be minimal. However, to avoid any interaction through pump depletion effects, it would be better to use Raman cascaded orders in two separate amplifier cavities. Moreover, the dispersion difference between signals at 1310 $\mu$m and 1550 $\mu$m will be quite large, typically about 16 psec/nm-km in standard or dispersion-shifted fiber. The large amount of group-velocity dispersion should lead to minimal nonlinear cross-talk between the two windows. For example, the four-wave mixing penalty will be minimal because the large dispersion leads to poor phase-matching. Also, the large dispersion leads to a rapid walk-off between pulses at the two wavelengths, so the interaction length will be short.

The two-wavelength optical fiber amplifier can be implemented on the improvements described in this application as well as on the basic framework of the Sagnac Raman amplifier. To avoid cross-talk through pump depletion, the two wavelengths should be amplified in parallel. However, since the pump laser is the most expensive part of the amplifiers, to the extent possible the pump laser should be shared.

Figure 22A:
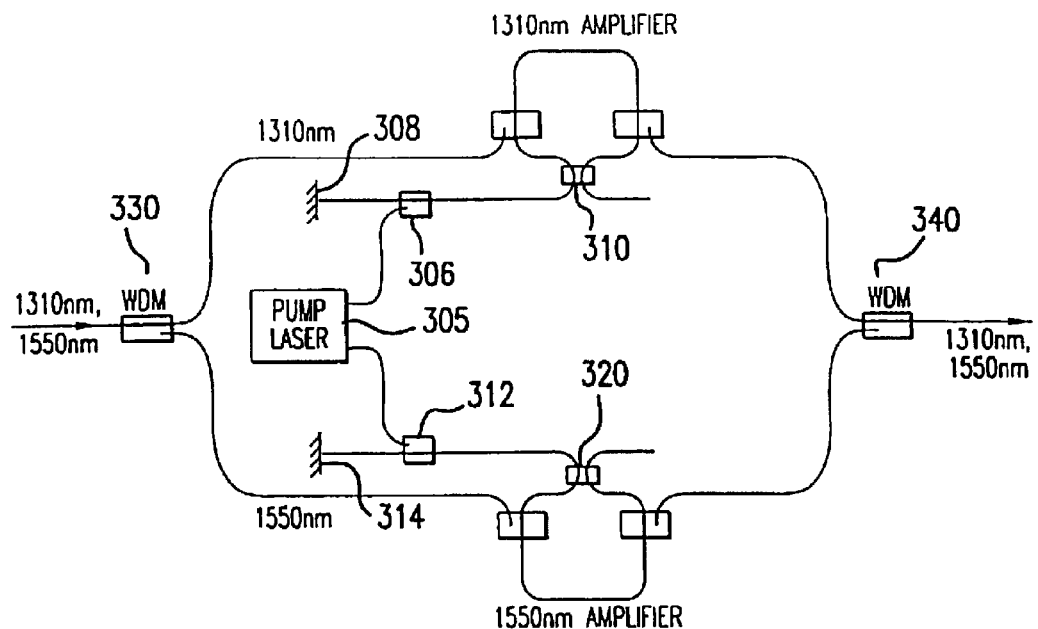
FIG. 22a is a diagrammatic illustration of a parallel combination of Sagnac Raman amplifiers for amplifying both wavelengths while using a common pump laser.
Figure 22B:
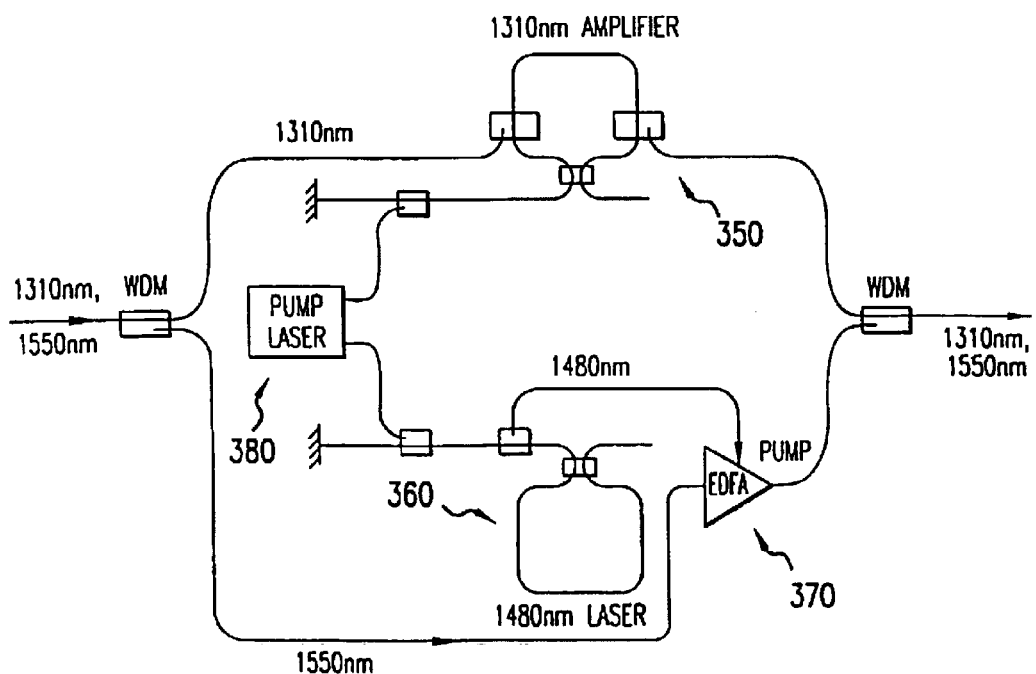
FIG. 22b is a diagrammatic illustration of one Sagnac Raman amplifier for 1310 nm, and another Sagnac Raman laser operating at 1480 nm for pumping of an EDFA at 1550 nm. Both the Sagnac amplifier and laser share a common pump laser.
Figure 22C:
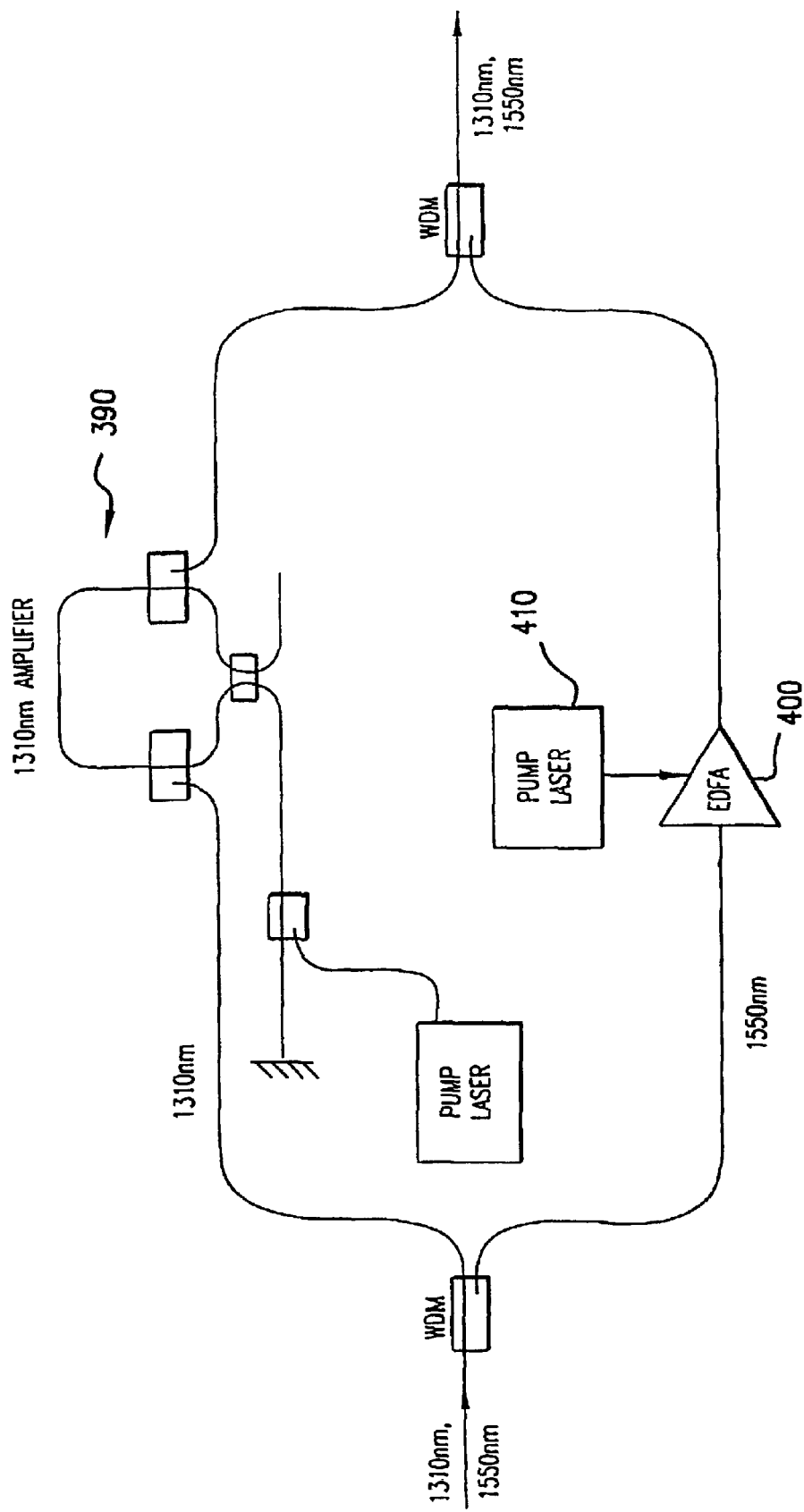
FIG. 22c illustrates the use of a Sagnac Raman amplifier for 1310 nm in parallel with an EDFA for 1550 nm amplification.

FIGS. 22a–22c illustrate several preferred embodiments of the two-wavelength amplifier. In all of these configurations, 1310/1550 nm WDMs are used to separate the incoming signals and then eventually combine the amplified signals. In FIG. 22a, two Sagnac Raman amplifiers such as that of FIG. 2 are used in parallel to form the two-wavelength amplifier. The 1310 nm amplifier comprises a reflector 308 and a Sagnac loop mirror 310 having a loop and a coupler attached at the base of the loop. Similarly the 1550 nm amplifier comprises a reflector 314 and a Sagnac loop mirror 320 having a loop and a coupler attached at the base of the loop. Both the 1310 nm and 1550 nm amplifiers are powered by a common pump laser 305 through couplers 306 and 312 respectively. An input optical signal is divided into two beams by a WDM 330, and the two beams are sent to input ports of the 1310 nm and 1550 nm amplifiers respectively. After amplification by these amplifiers, the output signals from each of the amplifiers are combined by a WDM 340. Note that to change the operating wavelength of the Sagnac amplifier, the wavelength specifications for the 50:50 coupler 310 or 320 and the WDM couplers 330 and 340 for injecting and removing the signal must be adjusted.

Because of the high efficiency and mature technology of EDFAs, it may alternately be desirable to use an EDFA to amplify the signal channel at 1550 nm. FIGS. 22b and 22c illustrate two exemplary configurations for employing a combination of Raman amplifiers and EDFAs. In FIG. 22b, a two-wavelength amplifier comprises a Sagnac Raman amplifier 350 to amplify a 1310 nm signal and an EDFA 370 to amplify a 1550 nm signal. The Sagnac Raman amplifier has the same configuration as that depicted in FIG. 2 which primarily comprises two reflectors, one of which is a Sagnac loop mirror. The EDFA is pumped by a Sagnac Raman cascade laser 360 such as in FIG. 8 that generates a 1480 nm light. The Sagnac Raman amplifier and cascade laser share a common pump laser 380.

Finally, FIG. 22c illustrates a two-wavelength amplifier that comprises a Sagnac Raman amplifier 390 to amplify a 1310 nm signal and an EDFA 400 to amplify a 1550 nm signal. The Sagnac Raman amplifier has the same configuration as that depicted in FIG. 2 which primarily comprises two reflectors, one of which is a Sagnac loop mirror. The EDFA 400 is pumped by its own 980 nm or 1480 nm pump unit 410. Since the pump laser is the single most expensive element in a typical EDFA or Raman amplifier, one advantage of the shared pump of FIG. 22a or 22b will be reduced cost of the unit. However, the configuration of FIG. 22c may also be advantageous when upgrading an existing 1550 nm amplifier unit. It should be clear that the Sagnac Raman amplifiers and lasers pictured in FIGS. 22a–22c can embody any of the improvements, such as broadband response and lower noise spectrum, discussed elsewhere in this patent.

It should be noted that the gain for the two channels and the division of the power of the shared pump may be different for the parallel paths. For example, as shown in the loss curve of FIG. 1a, the loss around 1550 nm is typically about 0.2 dB/km, while the loss around 1310 nm is typically about 0.35 dB/km. Therefore, for the same spacing of amplifiers at 1310 nm and 1550 nm in a fiber-optic link, the amplifier at 1310 nm will have to provide more gain than the 1550 nm unit. Moreover, since the Raman amplifier at 1550 nm (six orders) or 1480 nm (five orders) requires more cascaded orders than when operated at 1310 nm (three orders), the pump power to achieve the same gain level will be higher as the wavelength increases. Consequently, adjusting the splitting ratio of the pump to the two units can satisfy the different pumping requirements. Alternately, note from Table II that there may be different optimal pump wavelengths to reach specific end gain windows. Therefore, a broadband pump such as those described in FIGS. 14a–14c might be divided spectrally using wavelength selective elements (i.e., gratings, WDMs or filters) rather than on the basis of power.

While the present invention has been described in a number of different exemplary embodiments, it will be understood that the principles of the invention can be extended to still further embodiments and that the embodiments illustrated here are not intended to limit the scope of the invention as set forth in the appended claims.

What is claimed is:

1. A Raman amplifier stage comprising:
   a Raman gain medium operable to receive a multiple wavelength optical signal;
   a pump assembly operable to generate at least one pump wavelength for introduction to the gain medium, the pump assembly comprising a light source operable to generate the at least one pump wavelength at a desired intensity by controlling a drive current supplied to the light source; and
   a coupler operable to introduce the at least one pump wavelength to the gain medium to facilitate Raman amplification of at least a portion of the multiple wavelength optical signal;
   wherein the pump assembly controls at least an intensity of the at least one pump wavelength to affect the shape of a gain curve associated with the multiple wavelength optical signal in the Raman amplifier stage by controlling the current supplied to the light source.

2. The Raman amplifier stage of claim 1, wherein the gain medium comprises a distributed gain medium.

3. The Raman amplifier stage of claim 1, wherein the gain medium comprises an optical fiber.

4. The Raman amplifier stage of claim 1, wherein the pump assembly operates to generate a plurality of pump wavelengths.

5. The Raman amplifier stage of claim 4, wherein the intensities of at least some of the plurality of pump wavelengths are controlled by the pump assembly to affect the shape of the gain curve associated with the multiple wavelength optical signal in the amplifier stage.

6. The Raman amplifier stage of claim 4, further comprising a wavelength selector operable to select one or more of the plurality of pump wavelengths for application to the gain medium.

7. The Raman amplifier stage of claim 6, wherein the wavelength selector comprises a wavelength selecting element selected from the group consisting of gratings and one or more Fabry-Perot wavelength filters.

8. The Raman amplifier stage of claim 4, wherein the pump assembly comprises an array of laser diodes.

9. The Raman amplifier stage of claim 4, wherein the pump assembly comprises:
   a pump laser having an output port and producing a pump beam; and
   a bandwidth adding mirror connected to said output port to generate a broadened pump spectrum.

10. The Raman amplifier stage of claim 9, wherein said bandwidth adding mirror includes a polarization controller.

11. The Raman amplifier stage of claim 9, wherein the bandwidth adding mirror includes a phase modulator.

12. The Raman amplifier stage of claim 9, wherein the bandwidth adding mirror includes an amplitude modulator.

13. The Raman amplifier stage of claim 9, wherein the pump laser comprises a cladding pumped fiber laser.

14. The Raman amplifier stage of claim 13, wherein the cladding pumped fiber laser is driven by a modulated drive signal.

15. The Raman amplifier stage of claim 4, wherein the plurality of pump wavelengths contribute to a pump spectrum comprising a plurality of peaks.

16. The Raman amplifier stage of claim 15, wherein the plurality of peaks comprise at least three (3) peaks.

17. The Raman amplifier stage of claim 15, wherein the plurality of peaks comprise at least four (4) peaks.

18. The Raman amplifier stage of claim 15, wherein the at least two of the plurality of peaks are separated by a line width of at least one of the peaks at one half power of that peak.

19. The Raman amplifier stage of claim 15, wherein at least two of the peaks comprise different amplitudes.

20. The Raman amplifier stage of claim 15, wherein each of the peaks comprises an amplitude within ten (10) decibels of each of the others of the plurality of peaks.

21. The Raman amplifier stage of claim 15, wherein each peak resides at a different center wavelength.

22. The Raman amplifier stage of claim 15, wherein each of the plurality of peaks is spaced from all adjacent peaks by a substantially uniform wavelength spacing.

23. The Raman amplifier stage of claim 15, wherein a wavelength spacing between a first pair of adjacent peaks of the plurality of peaks is different than a wavelength spacing between a second pair of adjacent peaks of the plurality of peaks.

24. The Raman amplifier stage of claim 1, wherein the pump assembly comprises a pump laser current modulator.

25. The Raman amplifier stage of claim 1, wherein the intensity of the at least one pump wavelength is controlled to provide a more flat gain curve associated with the multiple wavelength optical signal in the amplifier stage.

26. The Raman amplifier stage of claim 1, further comprising a gain flattening element coupled to the gain medium and operable to reduce variations in amplitude as a function of wavelength of the multiple wavelength optical signal output from the gain medium.

27. The Raman amplifier stage of claim 1, further comprising:
   an input port capable of receiving the multiple wavelength optical signal; and
   an output port capable of communicating the amplified multiple wavelength optical signal.

28. A method of controlling the shape of a gain curve of a Raman amplifier stage, comprising:
   receiving a multiple wavelength signal at a Raman gain medium of a Raman amplifier stage;
   manipulating an intensity of a pump wavelength; and
   introducing the pump wavelength to the gain medium to facilitate Raman amplification of at least a portion of the multiple wavelength signal over at least a portion of the gain medium;
   wherein the shape of the gain curve for the amplifier stage is determined at least in part based on the manipulation of the intensity of the pump wavelength.

29. The method of claim 28, wherein the pump wavelength comprises a multiple wavelength pump signal comprising a plurality of pump wavelengths.

30. The method of claim 29, wherein manipulating at least an intensity of the pump wavelength comprises manipulating at least an intensity of at least some of a plurality of pump wavelengths.

31. The method of claim 29, wherein the intensities of at least some of the plurality of pump wavelengths are manipulated to affect the shape of the gain curve associated with the multiple wavelength optical signal in the amplifier stage.

32. The method of claim 29, wherein the plurality of pump wavelengths contribute to a pump spectrum comprising a plurality of peaks.

33. The method of claim 32, wherein the plurality of peaks comprise at least three (3) peaks.

34. The method of claim 32, wherein the plurality of peaks comprise at least four (4) peaks.

35. The method of claim 32, wherein the at least two of the plurality of peaks are separated by a line width of at least one of the peaks at one half power of that peak.

36. The method of claim 32, wherein at least two of the peaks comprise different amplitudes.

37. The method of claim 32, wherein each of the peaks comprises an amplitude within ten (10) decibels of each of the others of the plurality of peaks.

38. The method of claim 32, wherein each peak resides at a different center wavelength.

39. The method of claim 32, wherein each of the plurality of peaks is spaced from all adjacent peaks by a substantially uniform wavelength spacing.

40. The method of claim 32, wherein a wavelength spacing between a first pair of adjacent peaks of the plurality of peaks is different than a wavelength spacing between a second pair of adjacent peaks of the plurality of peaks.

41. The method of claim 28, wherein the shape of the gain curve for the amplifier stage is determined at least in part based on a selection of a wavelength of the pump wavelength.

42. The method of claim 41, wherein selecting a wavelength of the pump wavelength comprises selectively passing one pump wavelength from a plurality of pump wavelengths received.

43. The method of claim 28, wherein manipulating at least the intensity of the pump wavelength comprises controlling a drive current to a light source generating the pump wavelength to control the intensity of the pump wavelength.

44. The method of claim 28, further comprising:
producing a pump beam; and
directing the pump beam to a bandwidth adding mirror to generate a broadband pump spectrum;
wherein the pump wavelength comprises at least a portion of the broadband pump spectrum.

45. The method of claim 28, wherein the gain medium comprises an optical fiber.

46. The method of claim 28, further comprising applying a gain flattening element to the multiple wavelength optical signal to reduce variations in amplitude as a function of wavelength in the multiple wavelength optical signal.

47. A Raman amplifier stage comprising:
a pump assembly operable to generate a plurality of pump wavelengths for introduction to a Raman gain medium carrying a multiple wavelength optical signal, the plurality of pump wavelengths comprising a pump spectrum having a shape, the pump assembly comprising one or more light sources operable to generate the plurality of pump wavelengths at specified intensities by controlling a current supplied to the light source, wherein the pump assembly tailors the shape of the pump spectrum operable to be tailored to affect a desired shape of a gain curve for the multiple wavelength optical signal by controlling the current supplied to the light source; wherein the pump spectrum facilitates Raman amplification of at least a portion of the multiple wavelength signal over at least a portion of the gain medium, and wherein the shape of the gain curve for the multiple wavelength signal is determined at least in part by the shape of the pump spectrum.

48. The Raman amplifier stage of claim 47, wherein the shape of the pump spectrum is tailored by controlling the wavelengths of at least some of the pump wavelengths.

49. The Raman amplifier stage of claim 47, further comprising a wavelength selector operable to select one or more of the plurality of pump wavelengths for application to the gain medium.

50. The Raman amplifier stage of claim 47, wherein the pump spectrum comprises a plurality of peaks.

51. The Raman amplifier stage of claim 50, wherein the plurality of peaks comprise at least three (3) peaks.

52. The Raman amplifier stage of claim 50, wherein the at least two of the plurality of peaks are separated by a line width of at least one of the peaks at one half power of that peak.

53. The Raman amplifier stage of claim 50, wherein at least two of the peaks comprise different amplitudes.

54. The Raman amplifier stage of claim 50, wherein each of the peaks comprises an amplitude within ten (10) decibels of each of the others of the plurality of peaks.

55. The Raman amplifier stage of claim 50, wherein each peak resides at a different center wavelength.

56. The Raman amplifier stage of claim 50, wherein each of the plurality of peaks is spaced from all adjacent peaks by a substantially uniform wavelength spacing.

57. The Raman amplifier stage of claim 50, wherein a wavelength spacing between a first pair of adjacent peaks of the plurality of peaks is different than a wavelength spacing between a second pair of adjacent peaks of the plurality of peaks.

58. The Raman amplifier stage of claim 47, wherein the pump assembly comprises:
a pump laser having an output port and producing a pump beam; and
a bandwidth adding mirror connected to said output port to generate a broadened pump spectrum.

59. The Raman amplifier stage of claim 47, wherein the pump assembly comprises an array of laser diodes.

60. The Raman amplifier stage of claim 47, wherein the Raman gain medium comprises an optical fiber.

61. The Raman amplifier stage of claim 47, further comprising a gain flattening element coupled to the gain medium and operable to reduce variations in amplitude as a function of wavelength of the multiple wavelength optical signal output from the gain medium.

62. The Raman amplifier stage of claim 47, further comprising:
an input port capable of receiving the multiple wavelength optical signal; and
an output port capable of communicating the amplified multiple wavelength optical signal.

63. A method of controlling the shape of a gain curve of a Raman amplifier stage, comprising:
receiving a multiple wavelength signal at a Raman gain medium of a Raman amplifier stage;
generating a pump spectrum comprising a plurality of pump wavelengths; tailoring the shape of at least a portion of the pump spectrum to affect a desired shape of a gain curve for the multiple wavelength signal; and
introducing the pump spectrum to the gain medium to facilitate Raman amplification of at least a portion of the multiple wavelength signal over at least a portion of the gain medium, wherein the shape of the gain curve for the multiple wavelength signal is determined at least in part by the shape of the pump spectrum.

64. The method of claim 63, wherein tailoring the shape of the pump spectrum comprises selecting wavelengths of at least some of the plurality of pump wavelengths.

65. The method of claim 63, wherein tailoring the shape of the pump spectrum comprises selectively passing to the gain medium one or more pump wavelengths from a plurality of pump wavelengths received.

66. The method of claim 63, wherein the tailoring the shape of the pump spectrum comprises selecting the intensity of at least some of the plurality of pump wavelengths.

67. The method of claim 63, wherein the plurality of pump spectrum comprises a plurality of peaks.

68. The method of claim 67, wherein the plurality of peaks comprise at least three (3) peaks.

69. The method of claim 67, wherein the at least two of the plurality of peaks are separated by a line width of at least one of the peaks at one half power of that peak.

70. The method of claim 67, wherein at least two of the peaks comprise different amplitudes.

71. The method of claim 67, wherein each of the peaks comprises an amplitude within ten (10) decibels of each of the other of the plurality of peaks.

72. The method of claim 67, wherein each peak resides at a different center wavelength.

73. The method of claim 67, wherein each of the plurality of peaks is spaced from all adjacent peaks by a substantially uniform wavelength spacing.

74. The method of claim 67, wherein a wavelength spacing between a first pair of adjacent peaks of the plurality of peaks is different than a wavelength spacing between a second pair of adjacent peaks of the plurality of peaks.

75. The method of claim 63, further comprising:
    producing a pump beam; and
    directing the pump beam to a bandwidth adding mirror to generate a broadband pump spectrum;
    wherein the pump wavelength comprises at least a portion of the broadband pump spectrum.

76. The method of claim 63, wherein the gain medium comprises an optical fiber.

77. The method of claim 63, further comprising applying a gain flattening element to the multiple wavelength optical signal to reduce variations in amplitude as a function of wavelength in the multiple wavelength optical signal.

78. A Raman amplifier stage comprising:
    a Raman gain medium operable to receive a multiple wavelength optical signal;
    a pump assembly operable to generate at least one pump signal for introduction to the gain medium, the pump assembly comprising a wavelength selector operable to select a desired wavelength; and
    a coupler operable to introduce the at least one pump signal to the gain medium to facilitate Raman amplification of at least a portion of the multiple wavelength optical signal,
    wherein the wavelength selected by the wavelength selector is chosen to affect a desired shape of a gain curve associated with the multiple wavelength optical signal in the Raman amplifier stage.

79. A Raman amplifier stage comprising:
    a pump assembly operable to generate a plurality of pump wavelengths for introduction to a Raman gain medium carrying a multiple wavelength optical signal, the plurality of pump wavelengths comprising a pump spectrum having a shape, the pump assembly comprising a wavelength selector operable to select the plurality of pump wavelengths, wherein the wavelength selector tailors the shape of the pump spectrum to affect a desired shape of a gain curve for the multiple wavelength optical signal by selecting the plurality of pump wavelengths;
    wherein the pump spectrum facilitates Raman amplification of at least a portion of the multiple wavelength signal over at least a portion of the gain medium, and wherein the shape of the gain curve for the multiple wavelength signal is determined at least in part by the shape of the pump spectrum.

* * * * *